US006866981B2

United States Patent
Furukawa et al.

(10) Patent No.: US 6,866,981 B2
(45) Date of Patent: Mar. 15, 2005

(54) LIGHT-SENSITIVE COMPOSITION

(75) Inventors: Akira Furukawa, Tokyo (JP); Kunihiro Doi, Tokyo (JP)

(73) Assignee: Mitsubishi Paper Mills Limited, Tokyo (JP)

( * ) Notice: Subject to any disclaimer, the term of this patent is extended or adjusted under 35 U.S.C. 154(b) by 120 days.

(21) Appl. No.: 10/283,071

(22) Filed: Oct. 30, 2002

(65) Prior Publication Data

US 2003/0190548 A1 Oct. 9, 2003

(30) Foreign Application Priority Data

Oct. 31, 2001 (JP) ........................................ 2001-334340
Oct. 9, 2002 (JP) ........................................ 2002-295956

(51) Int. Cl.$^7$ .............................................. G03F 7/004
(52) U.S. Cl. ................ 430/270.1; 430/281.1; 430/286.1; 430/905; 430/910; 430/913; 430/926; 430/287.1
(58) Field of Search .................... 430/270.1, 281.1, 430/286.1, 287.1, 905, 910, 913, 926

(56) References Cited

U.S. PATENT DOCUMENTS

| | | | | |
|---|---|---|---|---|
| 3,936,429 A | * | 2/1976 | Seoka et al. ................. | 525/279 |
| 6,447,978 B1 | * | 9/2002 | Leon et al. ............... | 430/270.1 |
| 6,451,500 B1 | * | 9/2002 | Leon ........................ | 430/270.1 |
| 6,569,603 B2 | * | 5/2003 | Furukawa ................ | 430/287.1 |

* cited by examiner

*Primary Examiner*—Yvette C. Thornton
(74) *Attorney, Agent, or Firm*—Paul E. White, Jr.; Manelli Denison & Selter PLLC

(57) ABSTRACT

There are disclosed a light-sensitive composition which comprises (A) at least one water-soluble polymer selected from a cationic water-soluble polymer having a phenyl group substituted by a vinyl group at a side chain of the polymer and a water-soluble polymer having a phenyl group substituted by a vinyl group and a sulfonate group at a side chain of the polymer, and (B) at least one of a photopolymerization initiator and a photo-acid generator; and a light-sensitive composition which comprises at least one cationic monomer having two or more polymerizable unsaturated groups in the molecule, at least one polymer, and at least one of a photopolymerizable initiator and a photo-acid generator.

20 Claims, No Drawings

LIGHT-SENSITIVE COMPOSITION

BACKGROUND OF THE INVENTION

1. Field of the Invention

This invention relates to a light-sensitive composition which can be used for preparation of a lithographic printing plate, a resist for forming a printed circuit, a color filter and a phosphor pattern, particularly to a light-sensitive composition suitable for a lithographic printing plate. More specifically, it relates to a light-sensitive composition which is capable of forming an image by using a scanning exposure device such as laser, etc. Also, it relates to a lithographic printing plate which is capable of mounting to a printing machine without carrying out development and of printing.

2. Prior Art

As a light-sensitive composition capable of developing with water, there has been used, for example, a light-sensitive composition in which a dichromate is added to a water-soluble polymer such as gelatin, polyvinyl alcohol and the like as a material for color filter. However, it involved a problem in a treatment of a disposed liquid containing a chromate, so that other various systems have been investigated in place of the above light-sensitive composition.

One of which is a water-developable light-sensitive material utilizing a polymer in which a quaternary ammonium salt compound such as a styryl pyridinium salt compound and a styryl quinolinium salt compound is condensed to polyvinyl alcohol as disclosed in Japanese Patent Publications No. 5761/1981and No. 5762/1981, and Japanese Provisional Patent Publication No. 11906/1981.

However, such a composition cannot show sufficient characteristics in resolution and sensitivity.

On the other hand, a light-sensitive material in which a water-soluble azide compound and a water-soluble polymer capable of crosslinking by the compound are combined has been well known. As the water-soluble polymer in this case, there are disclosed a polyvinyl alcohol-maleic acid copolymer in Japanese Provisional Patent Publication No. 97602/1973 and a polyvinyl alcohol-acrylamide copolymer in Japanese Provisional Patent Publication No. 97603/1973, but they are low sensitivity. Similarly, as disclosed in Japanese Provisional Patent Publication No. 90185/1973, when polyvinylpyrrolidone is used as a water-soluble polymer, relatively high sensitivity with a certain extent can be obtained but it is insufficient. Also, in a system using a poly (meth)acrylamide-diacetone acrylamide copolymer as disclosed in Japanese Patent Publication No. 20225/1977 or Japanese Provisional Patent Publication No. 2000-248027, the resulting material is insufficient in resolution and sensitivity.

To accomplish high sensitivity, an example in which a light-sensitive azide group is introduced into a water-soluble polymer itself has been disclosed, for example, in Japanese Provisional Patent Publications No. 185163/1997 and No. 84655/1999, but it is difficult to obtain a material excellent in both of high sensitivity and preservation stability, and the material cannot be used practically.

Similarly, an example of a light-sensitive composition capable of subjecting to water-development by incorporating a polymerizable unsaturated group to a side chain of polyvinyl alcohol and using a photopolymerization initiator has been disclosed in Japanese Provisional Patent Publication No. 2000-181062 to obtain a high sensitivity material. In this case, the group having the polymerizable unsaturated group incorporated into the side chain is introduced as a side chain of the polyvinyl alcohol by an acetal reaction. Thus, when an incorporation ratio is increased to heighten sensitivity, water-solubility of the resulting polymer is decreased whereby there is a problem that water-developability is lowered.

Moreover, when the above-mentioned water-developable light-sensitive composition is intended to use for a lithographic printing plate, an image portion after development is extremely poor in lipophilic property, and image strength is weak since it is swelled by water, so that it cannot endure for usual lithographic printing.

Also, in Japanese Patent Publication No. 13020/1980, a light-sensitive composition using a cationic water-soluble polymer having an unsaturated group. The light-sensitive composition of said publication utilizes photodimerization of unsaturated double bonds, and this is similar reaction mechanism as photodimerization of cinnamic acid or styryl pyridinium salt. This reaction mechanism of the photodimerization does not interpose a photopolymerization initiator or a photo-acid generator. Accordingly, this is different from a cross-linking reaction inevitably using a photopolymerization initiator or a photo-acid generator of the present invention, and the constitution of the present invention is never described in the above publication. Also, the light-sensitive composition of said publication is only sensitized by ultraviolet rays. Moreover, it is low sensitivity since no amplification process is contained and high energy is required for exposure, and further it has no sensitivity to light in the region of visible rays to near infrared rays, so that it cannot correspond to an output machine using a laser beam mentioned below.

In Japanese Provisional Patent Publication No. 101620/1997, a light-sensitive resin composition using a polymer having a cationic group and a (meth)acryloyl group at a side chain has been disclosed. This is a printing plate material corresponding to flexographic printing, and there are problems that water-developability is poor and development requires for a long period of time. Moreover, when said light-sensitive composition is used for a lithographic printing plate, there are problems that ink-adhering property and printing endurance are poor.

In the field of a lithographic printing plate, according to progress of an image forming technique in recent years, a light-sensitive composition showing high sensitivity to visible rays has been desired. For example, research on a light-sensitive composition and a lithographic printing plate which correspond to an output machine using argon laser, helium-neon laser, red color LED and the like have actively been carried out.

Moreover, according to remarkable progress in a semiconductor laser, a near infrared laser light source of 700 to 1300 nm has been easily utilized, so that a light-sensitive composition and a lithographic printing plate which correspond to said laser light have been attracted attention. In addition, an image drawing device (a plate setter) utilizing a near infrared semiconductor laser emitting at around 400 nm has been commercially available, and a high sensitivity light-sensitive composition and a lithographic printing plate capable of forming an image (making plate) by the device have been desired to be developed.

As a photopolymerizable composition having light-sensitivity at the above visible rays to near infrared rays, there is disclosed a lithographic printing plate containing a compound which is capable of subjecting to radical polymerization and has an ethylenically unsaturated bond, a photosensitizing dye having an absorption peak at 400 to 500 nm and a polymerization initiator in Japanese Provisional Patent Publication No. 134007/1997. Also, a combination of an organic boron anion and a dye is disclosed in Japanese Provisional Patent Publications No. 143044/1987, No.150242/1987, No.5988/1993, No.194619/1993, No.197069/1993 and No. 2000-98603; a combination of a dye and an s-triazine type compound is disclosed in Japanese Provisional Patent Publications No. 31863/1992 and No. 43633/1994; a combination of a resol resin, a novolac resin, an infrared absorber and a photo-acid generator is disclosed in Japanese Provisional Patent Publications No. 20629/1995 and No. 271029/1995; and a combination of a specific polymer, a photo-acid generator and a near infrared sensitizing dye is disclosed in Japanese Provisional Patent Publications No. 212252/1999 and No. 231535/1999. Moreover, a light-sensitive composition using a polymer having a phenyl group substituted by a vinyl group is disclosed in Japanese Patent Publication No. 105353/1994 and Japanese Provisional Patent Publication No. 2001-290271.

However, in either of the above-mentioned examples, a binder polymer to be used in the light-sensitive layer is not water-soluble. When development is carried out, a strongly alkaline developing solution (a pH of which exceeds 10) dissolved therein a strongly alkaline compound such as sodium hydroxide, potassium hydroxide, potassium silicate and the like, so that development with water can hardly be carried out. Also, it is necessary to carry out development by using an automatic developing device for exclusive use.

To the contrary, a lithographic printing plate capable of effecting water-development or requiring no development itself is desired to be developed. For example, a non-treatment printing plate without requiring development which utilizes abrasion-removal of a binder polymer by irradiating a high output near infrared semiconductor laser has been proposed. For example, in Japanese Provisional Patent Publication No. 48018/1996, there is disclosed a method of preparing a lithographic printing plate by removing an ink-receptive polymer by abrasion and exposing a surface of a hydrophilic support by a cleaning agent. However, it causes grounds or scum remained after abrasion (which is so-called "debris") which causes optical contamination or background stain of a printing plate in some cases.

As other attempts, an example of a water-developable and heat-sensitive lithographic printing plate which utilizes the above-mentioned high output near infrared semiconductor laser, provides a layer containing thermoplastic polymer fine particles as a heat-sensitive layer and makes water-insoluble by fusing polymer fine particles utilizing higher heat generating at a laser irradiating portion is disclosed in Japanese Provisional Patent Publications No. 171250/1997, No. 186646/1998 and No. 265062/1999, and U.S. Pat. No. 6,001,536. This is a preferred system since development can be carried out on a printing machine by feeding dampening water but there are problems that sensitivity to laser light is low and background stain likely occurs.

SUMMARY OF THE INVENTION

Accordingly, an object of the present invention is to provide a light-sensitive composition having high sensitivity and capable of developing with water. In particular, it is to provide a light-sensitive composition having sufficiently high sensitivity by a scanning exposure using laser with visible rays to infrared rays and capable of developing with water. More specifically, it is to provide a light-sensitive composition preferably utilized for lithographic printing plate. Moreover, it is to provide a lithographic printing plate utilizing the light-sensitive composition of the present invention which is capable of mounting to a printing machine without carrying out development and of printing.

The above-mentioned objects of the present invention can be accomplished by using the following light-sensitive compositions (1) A light-sensitive composition comprises (A) at least one water-soluble polymer selected from a cationic water-soluble polymer having a phenyl group substituted by a vinyl group at a side chain of the polymer and a water-soluble polymer having both of a phenyl group substituted by a vinyl group and a sulfonate group at a side chain of the polymer, and (B) at least one of a photopolymerization initiator and a photo-acid generator.

(2) A light-sensitive composition comprises at least one cationic monomer having two or more polymerizable unsaturated groups in the molecule, at least one polymer and at least one of a photopolymerizable initiator and a photo-acid generator.

DESCRIPTION OF THE PREFERRED EMBODIMENTS

In the following, the embodiments of the present invention are explained in detail.

In the embodiment (1) of the present invention, the light-sensitive composition comprises, as a water-soluble polymer, (A) at least one water-soluble polymer selected from a cationic water-soluble polymer having a phenyl group substituted by a vinyl group at a side chain of the polymer (hereinafter abbreviated to as "water-soluble polymer A") and a water-soluble polymer having both of a phenyl group substituted by a vinyl group and a sulfonate group (a sulfonic acid salt group) at a side chain of the polymer (hereinafter abbreviated to as "water-soluble polymer B"), and (B) at least one of a photopolymerization initiator and a photo-acid generator.

The water-soluble polymer A to be used in the present invention means a polymer in which a phenyl group substituted by a vinyl group is introduced at a side chain of a water-soluble polymer having a cationic group. In the following, the water-soluble polymer A is explained in detail.

The cationic group in the water-soluble polymer A is a group selected from an organic onium group such as an ammonium group, a sulfonium group, a phosphonium group, an iodonium group, an oxonium group and the like, and of these, a quaternary ammonium group is most preferred.

A polymer in which the above-mentioned organic onium group is introduced can be synthesized by using conventionally known chemical reactions as disclosed in, for example, Japanese Patent Publication No. 13020/1980, Japanese Provisional Patent Publications No. 22766/1980, No. 153859/1999 and No. 2000-103179, U.S. Pat. Nos. 4,693,958 and 5,512,418. That is, there may be mentioned a method of subjecting to polymerization reaction of a monomer containing a desired organic onium group, a method of introducing an organic onium group into a trivalent N atom, a divalent S atom or a trivalent P atom introduced into a polymer chain constituting the polymer by a conventional alkylation reaction. Moreover, there may be mentioned a method of introducing an organic onium group into a polymer main chain or side chain by a nucleophilic substitution reaction between a nucleophilic reagent such as an amine, a sulfide, a phosphine and the like with a eliminable group (such as a sulfonic acid ester or a halide) on the polymer chain.

The phenyl group substituted by a vinyl group in the water-soluble polymer A is a group contributes to a photo-polymerization reaction or a photo-crosslinking reaction by the action of the photopolymerization initiator or the photo-acid generator. The phenyl group substituted by a vinyl group is preferably introduced into the polymer through a suitable linking group. The linking group in this case is not specifically limited, and an optional group, atom or composite group thereof may be mentioned. Moreover, these vinyl group and phenyl group may have a substituent(s). As the polymer into which a phenyl group substituted by a vinyl group is introduced, there may be mentioned a polymer having the following group represented by the formula (I) at the side chain of the polymer.

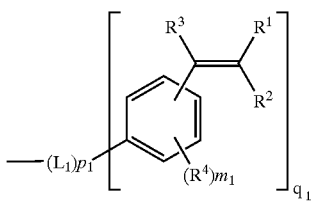

(I)

In the formula, $R^1$, $R^2$ and $R^3$ may be the same or different from each other and each represent a hydrogen atom, a halogen atom, a carboxyl group, a sulfo group, a nitro group, a cyano group, an amide group, an amino group, an alkyl group, an aryl group, an alkoxy group, an aryloxy group, an alkylthio group, an arylthio group, an alkylamino group, an arylamino group, an acyl group, an alkoxycarbonyl group, an aryloxycarbonyl group, an alkylsulfonyl group or an arylsulfonyl group. The above alkyl group and aryl group may be substituted by at least one of a halogen atom, a carboxyl group, a sulfo group, a nitro group, a cyano group, an amide group, an amino group, an alkyl group, an aryl group, an alkenyl group, an alkynyl group, a hydroxy group, an alkoxy group, an aryloxy group, an alkylthio group, an arylthio group, an alkylamino group, an arylamino group, an acyl group, an alkoxycarbonyl group, an aryloxycarbonyl group, an alkylsulfonyl group and an arylsulfonyl group. Of these, particularly preferred are those in which $R^1$ and $R^2$ are both hydrogen atoms, and $R^3$ is a hydrogen atom or a lower alkyl group having 4 or less carbon atoms (for example, a methyl group, an ethyl group and the like).

In the formula, $R^4$ represents a substitutable group. Such a group may include, for example, a halogen atom, a carboxyl group, a sulfo group, a nitro group, a cyano group, an amide group, an amino group, an alkyl group, an aryl group, an alkenyl group, an alkynyl group, a hydroxy group, an alkoxy group, an aryloxy group, an alkylthio group, an arylthio group, an alkylamino group, an arylamino group, an acyl group, an alkoxycarbonyl group, an aryloxycarbonyl group, an alkylsulfonyl group and an arylsulfonyl group. Also, the above alkyl group and aryl group constituting these groups may be substituted by at least one of a halogen atom, a carboxyl group, a sulfo group, a nitro group, a cyano group, an amide group, an amino group, an alkyl group, an aryl group, an alkenyl group, an alkynyl group, a hydroxy group, an alkoxy group, an aryloxy group, an alkylthio group, an arylthio group, an alkylamino group, an arylamino group, an acyl group, an alkoxycarbonyl group, an aryloxy-carbonyl group, an alkylsulfonyl group and an arylsulfonyl group.

In the formula, $m_1$ is an integer of 0 to 4, $p_1$ is an integer of 0 or 1, and $q_1$ is an integer of 1 to 4.

In the formula, $L_1$ represents a polyvalent linking group. More specifically, it represents a polyvalent linking group selected from at least one atom or atomic group consisting of a hydrogen atom, a carbon atom, a nitrogen atom, an oxygen atom and a sulfur atom. Further specifically, there may be mentioned a group constituted by a structural unit represented by the following formula and a heterocyclic group shown below. These groups may be used singly or in combination of optional two or more. Moreover, these groups may have at least one optional substituent.

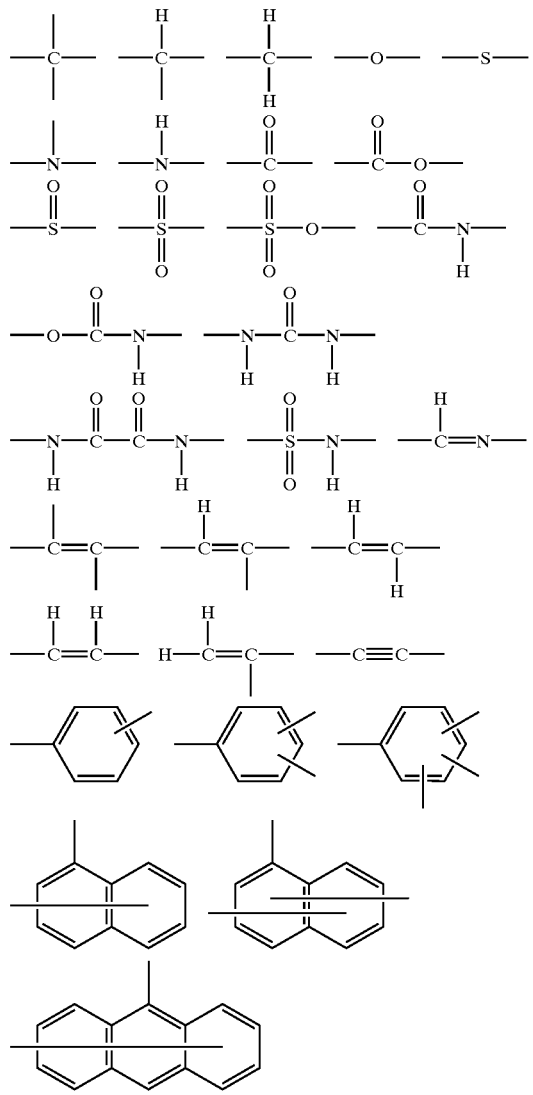

As the examples of the heterocyclic group constituting $L_1$, there may be mentioned, for example, a nitrogen-containing heterocyclic ring such as a pyrrole ring, a pyrazole ring, an imidazole ring, a triazole ring, a tetrazole ring, an isoxazole ring, an oxazole ring, an oxadiazole ring, an isothiazole ring, a thiazole ring, a thiadiazole ring, a thiatriazole ring, an indole ring, an indazole ring, a benzimidazole ring, a benzotriazole ring, a benzoxazole ring, a benzothiazole ring, a benzoselenazole ring, a benzothiadiazole ring, a pyridine ring, a pyridazine ring, a pyrimidine ring, a pyrazine ring, a triazine ring, a quinoline ring and a quinoxaline ring; and a furan ring and a thiophene ring; each of which may be substituted by at least one substituent.

When the above-mentioned polyvalent linking group has a substituent(s), there may be mentioned, as a substituent, a halogen atom, a carboxyl group, a sulfo group, a nitro group, a cyano group, an amide group, an amino group, an alkyl group, an aryl group, an alkenyl group, an alkynyl group, a hydroxy group, an alkoxy group, an aryloxy group, an alkylthio group, an arylthio group, an alkylamino group, an arylamino group, an acyl group, an alkoxycarbonyl group, an aryloxycarbonyl group, an alkylsulfonyl group and an arylsulfonyl group.

In the optional atomic group constituting the linking group ($L_1$), particularly preferably used is a case where an organic onium group such as a quaternary ammonium group and the like forming a cationic group is contained therein. When no organic onium group is contained in the linking group, it is necessary to separately contain a recurring unit having such an organic onium group in the recurring unit constituting the main chain of the polymer.

A method for introducing a phenyl group substituted by a vinyl group into the polymer is not specifically limited and any of the methods as disclosed in, for example, Japanese Patent Publications No. 34041/1974 and No. 105353/1994, and Japanese Provisional Patent Publications No. 2000-181062 and No. 2000-187322 may be used. In these cases, when a polymer which is a precursor is preliminary synthesized, it is necessary to introduce a recurring unit having an organic onium group provisionally in the form of a copolymer or after introducing a polymerizable unsaturated group into a precursor polymer, the organic onium group is formed by the method as mentioned above.

Specific examples of a monomer which can constitute the water-soluble polymer A may include an amino group-containing monomer such as allylamine, diallylamine, 2-dimethylaminoethyl acrylate, 2-dimethylaminoethyl methacrylate, 2-diethylaminoethyl acrylate, 2-diethylaminoethyl methacrylate, 3-diethylaminopropyl acrylamide, 3-diethylaminopropyl methacrylamide, 4-aminostyrene, 4-aminomethylstyrene, N,N-dimethyl-N-(4-vinylbenzyl)amine, N,N-diethyl-N-(4-vinylbenzyl)amine and the like, and a quaternary ammonium salt thereof; a nitrogen-containing heterocyclic ring-containing monomer such as 4-vinylpyridine, 2-vinylpyridine, N-vinylimidazole, N-vinylcarbazole and the like, and a quaternary ammonium salt thereof; a quaternary phosphonium salt monomer such as (4-vinylbenzyl)trimethylphosphonium bromide and the like; a tertiary sulfonium salt monomer such as dimethyl-2-methacryloyloxyethyl sulfonium methosulfate and the like; a halogenated alkyl group-containing monomer such as 2-chloro-methylstyrene, 4-chloromethylstyrene, 4-bromomethylstyrene, 2-chloroethyl acrylate, 2-chloroethyl methacrylate and the like, and the present invention is not limited by these.

Also, the water-soluble polymer A may be a copolymer with other optional monomer(s), and the monomer constituting the copolymer may be water-soluble or water-insoluble. Specific examples of the water-soluble monomer may include a carboxylic acid group-containing monomer such as acrylic acid, methacrylic acid, 2-carboxyethylacrylate, 2-carboxyethylmethacrylate, itaconic acid, crotonic acid, maleic acid, fumaric acid, cinnamic acid, monoalkyl maleate, monoalkyl fumarate, 4-carboxystyrene, acrylamide-N-glycolic acid and the like, and a salt thereof; a sulfonic acid group-containing monomer such as vinyl sulfonic acid, allyl sulfonic acid, methallyl sulfonic acid, styrene sulfonic acid, 2-sulfoethyl methacrylate, 3-sulfopropyl methacrylate, 2-acrylamide-2-methylpropane sulfonic acid and the like, and a salt thereof; a phosphoric acid group-containing monomer such as vinyl phosphonic acid and the like, and a salt thereof; an amino group-containing monomer such as allylamine, diallylamine, 2-dimethylaminoethyl acrylate, 2-dimethylaminoethyl methacrylate, 2-diethylaminoethyl acrylate, 2-diethylaminoethyl methacrylate, 3-diethylaminopropyl acrylamide, 3-diethylaminopropyl methacrylamide, 4-amino-styrene, 4-aminomethylstyrene, N,N-dimethyl-N-(4-vinyl-benzyl)amine, N,N-diethyl-N-(4-vinylbenzyl)amine and the like, and a quaternary ammonium salt thereof; a nitrogen-containing heterocyclic ring-containing monomer such as 4-vinylpyridine, 2-vinylpyridine, N-vinylimidazole, N-vinylcarbazole and the like, and a quaternary ammonium salt thereof; a (meth)acrylamide such as acrylamide, methacrylamide, N,N-dimethylacrylamide, N,N-dimethylmethacrylamide, N,N-diethylacrylamide, N-iso-propylmethacrylamide, diacetoneacrylamide, N-methylolacrylamide, 4-hydroxyphenylacrylamide and the like; a hydroxyalkyl (meth)acrylate such as 2-hydroxyethyl acrylate, 2-hydroxyethyl methacrylate, 2-hydroxypropyl acrylate, 2-hydroxypropyl methacrylate, glycerol monomethacrylate and the like; an alkyleneoxy group-containing (meth)acrylate such as methacrylic acid methoxydiethylene glycol monoester, methacrylic acid methoxypolyethylene glycol monoester, methacrylic acid polypropylene glycol monoester and the like; N-vinylpyrrolidone, N-vinylcaprolactam and the like, and the present invention is not limited by these examples. These water-soluble monomers may be used singly or in optional combination of two or more thereof.

Also, a copolymer with an optional water-insoluble monomer may be preferably used to optimize water-developability and to improve strength at an image portion. Examples of such water-insoluble monomers may include a styrene derivative such as styrene, 4-methylstyrene, 4-hydroxystyrene, 4-acetoxy-styrene, 4-chloromethylstyrene, 4-methoxystyrene and the like; an alkyl (meth)acrylate such as methyl acrylate, methyl methacrylate, ethyl acrylate, ethyl methacrylate, n-butyl methacrylate, n-hexylmethacrylate, 2-ethylhexylmethacrylate, cyclohexyl acrylate, dodecyl methacrylate and the like; an aryl (meth)acrylate or arylalkyl (meth)acrylate such as phenyl methacrylate, benzyl methacrylate and the like; acrylonitrile, methacrylonitrile, phenylmaleimide, hydroxyphenylmaleimide; a vinyl ester such as vinyl acetate, vinyl chloroacetate, vinyl propionate, vinyl lactate, vinyl stearate, vinyl benzoate and the like; a vinyl ether such as methyl vinyl ether, butyl vinyl ether and the like; and other various kinds of monomers such as acryloylmorpholine, tetrahydrofurfuryl methacrylate, vinyl chloride, vinylidene chloride, allyl alcohol, vinyltrimethoxy silane, glycidyl methacrylate, and the like. A copolymer constituted by an optional combination of these can be used as a water-soluble polymer A.

The water-soluble polymer A of the present invention is particularly preferably a polymer in which the phenyl group substituted by a vinyl group binds to a main chain through a cationic group. In an optional atomic group constituting the linking group to bind the phenyl group substituted by a vinyl group to the main chain, it is most preferred that an organic onium group such as a quaternary ammonium group which forms a cationic group is contained therein. In this case, a number of the phenyl group substituted by a vinyl group contained in the polymer is directly proportional to a number of the organic onium group, so that when a ratio of the phenyl group substituted by a vinyl group in the polymer is increased to improve sensitivity, solubility to water is not lowered whereby both of sensitivity and water-developability can be simultaneously satisfied. A polymer in which the phenyl group substituted by a vinyl group bonds to the polymer main chain through a cationic group is specifically a polymer having a group represented by the following formula:

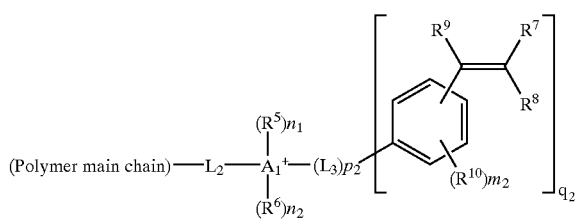

In the formula, $A_1^+$ represents an organic onium group selected from an ammonium group, a sulfonium group, a phosphonium group, an iodonium group and an oxonium group, and $n_1$ and $n_2$ each represent an integer of 0 or 1. When $A_1^+$ is an iodonium group, then $n_1=n_2=0$, when $A_1^+$ is a sulfonium group or an oxonium group, then $n_1=1$ and $n_2=0$ and when $A_1^+$ is an ammonium group or a phosphonium group, then $n_1=n_2=1$.

In the formula, $R^5$ and $R^6$ may be the same or different from each other and each represent an alkyl group (for example, a methyl group, an ethyl group, an isopropyl group, a cyclohexyl group, a benzyl group and the like), or an aryl group (for example, a phenyl group, a 1-naphthyl group and the like) These groups may be substituted by at least one substituent, and examples of the substituent may include a halogen atom, a carboxyl group, a sulfo group, a nitro group, a cyano group, an amide group, an amino group, an alkyl group, an aryl group, an alkenyl group, an alkynyl group, a hydroxy group, an alkoxy group, an aryloxy group, an alkylthio group, an arylthio group, an alkylamino group, an arylamino group, an acyl group, an alkoxycarbonyl group, an aryloxycarbonyl group, an alkylsulfonyl group and an arylsulfonyl group. Moreover, $R^5$ and $R^6$ may be a group containing a phenyl group substituted by a vinyl group represented by the above-mentioned formula (I).

In the formula, $R^7$, $R^8$ and $R^9$ may be the same or different from each other and each have the same meanings as $R^1$, $R^2$ and $R^3$ defined in the above-mentioned formula (I). Of these groups, preferred is the case where $R^7$ and $R^8$ are both hydrogen atoms and $R^9$ is a hydrogen atom or a lower alkyl group having 4 or less carbon atoms (for example, a methyl group, an ethyl group and the like). $R^{10}$ has the same meaning as $R^4$ in the above-mentioned formula (I). $L_2$ and $L_3$ each represent a polyvalent linking group, more specifically it represents a polyvalent linking group comprising an atom or atomic group selected from a hydrogen atom, a carbon atom, a nitrogen atom, an oxygen atom and a sulfur atom. $m_2$ is an integer of 0 to 4, $p_2$ is an integer of 0 or 1, and $q_2$ is an integer of 1 to 4.

Also, a N atom, a S atom or a P atom constituting the organic onium group represented by $A_1^+$ may form a ring structure (for example, a pyridinium ring, a 2-quinolinium ring, a morpholinium ring, a piperidinium ring, a pyrrolidinium ring, a tetra-hydrothiophenium ring and the like) with at least one group optionally selected form $R^5$, $R^6$, $L_2$ and $L_3$. These ring structures may be substituted by at least one substituents selected from a halogen atom, a carboxyl group, a sulfo group, a nitro group, a cyano group, an amide group, an amino group, an alkyl group, an aryl group, an alkenyl group, an alkynyl group, a hydroxy group, an alkoxy group, an aryloxy group, an alkylthio group, an arylthio group, an alkylamino group, an arylamino group, an acyl group, an alkoxycarbonyl group, an aryloxycarbonyl group, an alkylsulfonyl group and an arylsulfonyl group.

Also, in the water-soluble polymer A of the present invention, in addition to the polymer having a recurring unit in which the phenyl group substituted by a vinyl group binds to a main chain through a cationic group as mentioned above, there may be used a polymer having a recurring unit in which the phenyl group substituted by a vinyl group directly binds to a main chain or through a linking group containing no cationic group and a recurring unit having a cationic group.

Examples of the water-soluble polymer A according to the present invention are shown below, but the present invention is not limited by these. A number in the exemplified structural formula means a percent by weight (wt %) of the respective recurring unit in the copolymer as a total composition of 100% by weight.

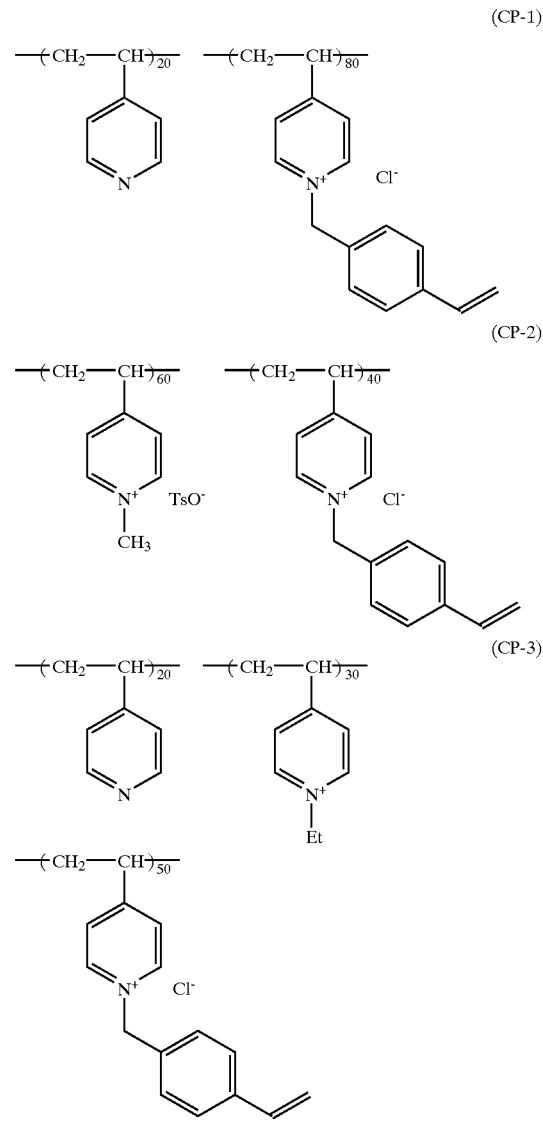

(CP-4)
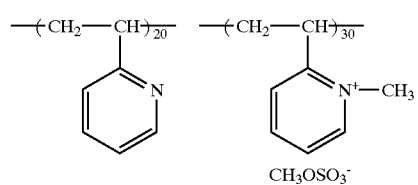
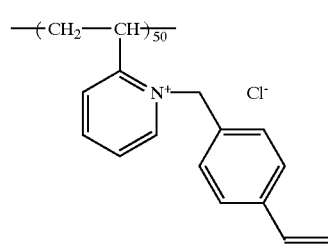
(CP-5)
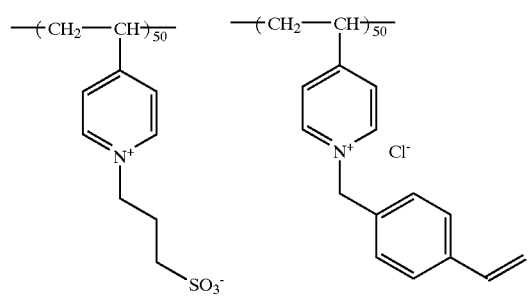
(CP-6)
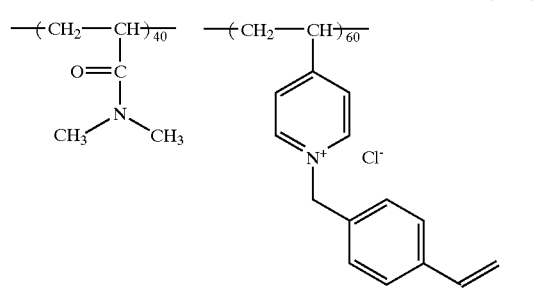
(CP-7)
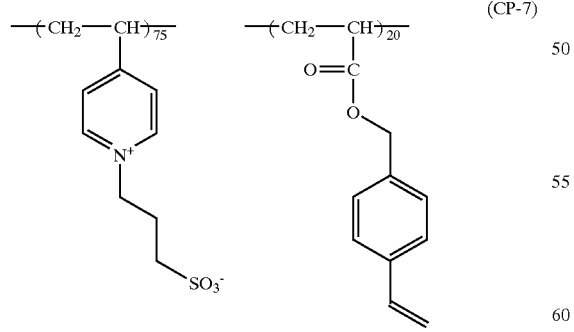
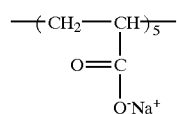
(CP-8)
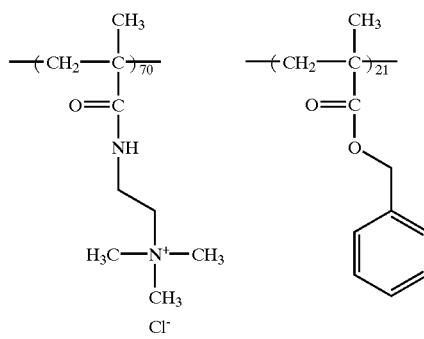
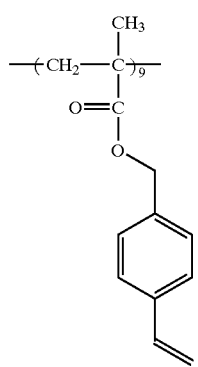
(CP-9)
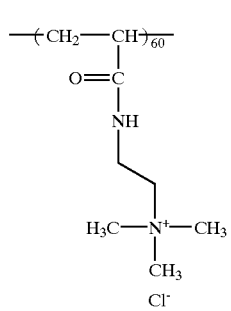
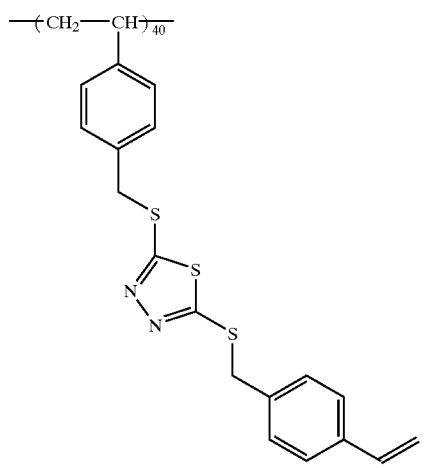

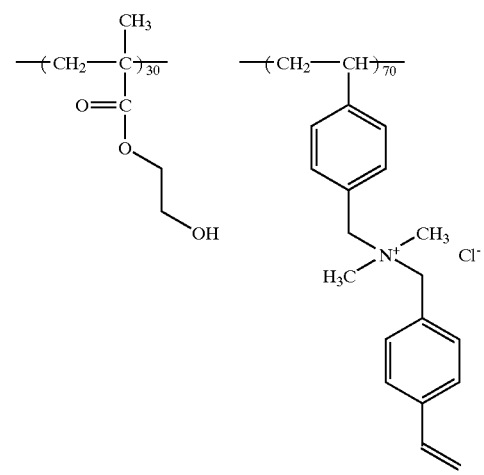
(CP-10)
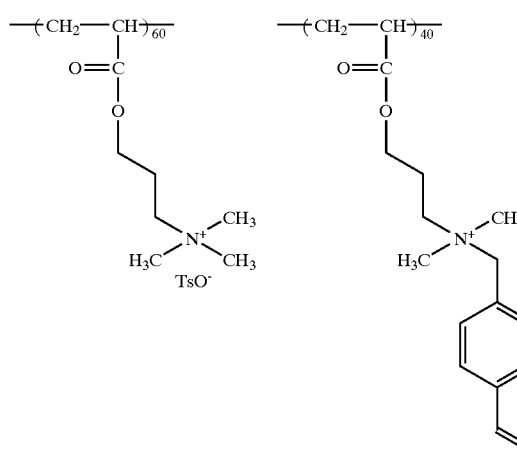
(CP-11)
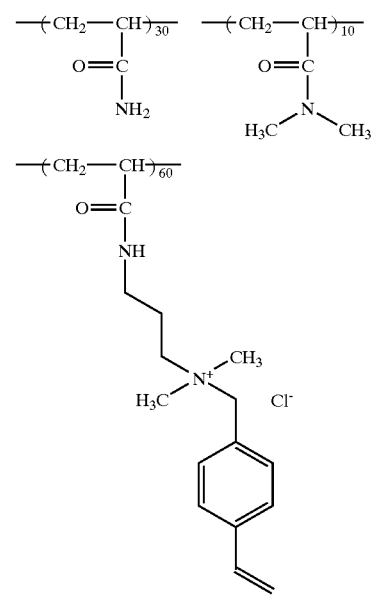
(CP-12)
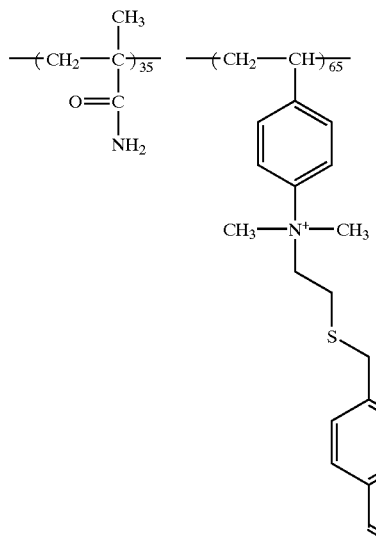
(CP-13)
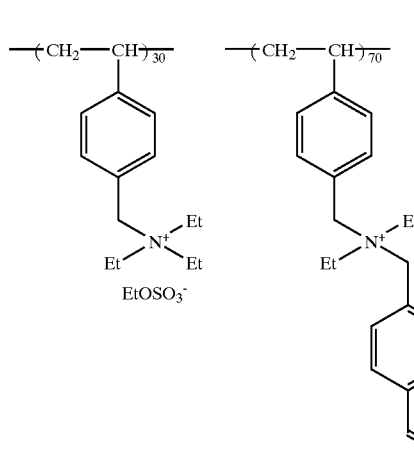
(CP-14)
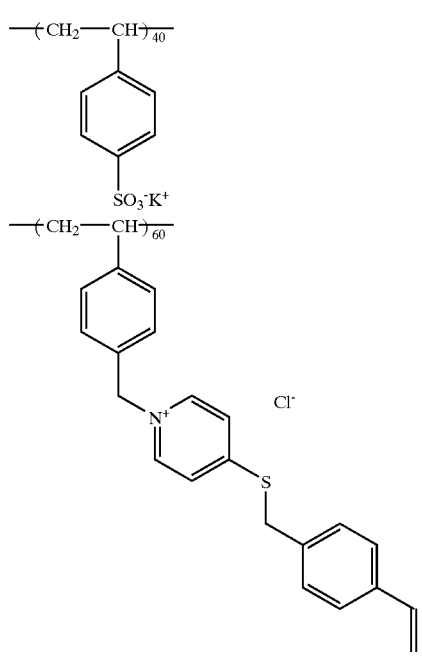
(CP-15)

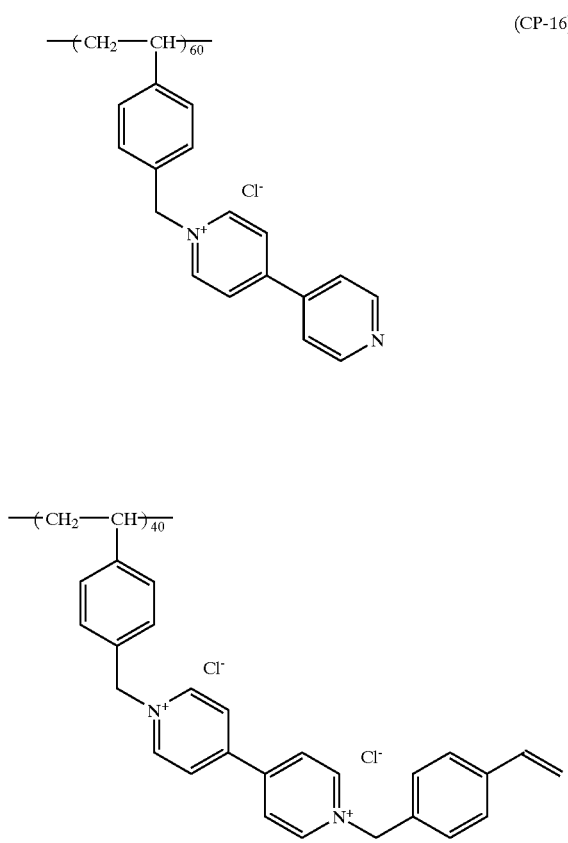

(CP-16)

(CP-17)

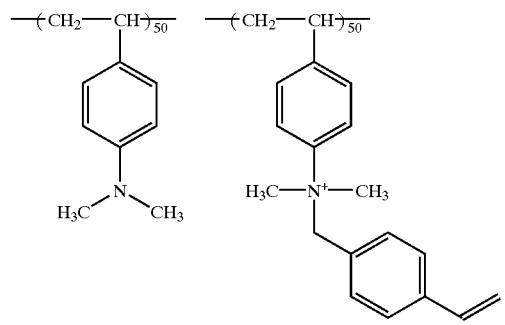

(CP-18)

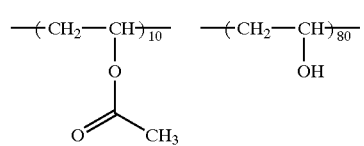

With regard to ratios of the respective recurring units constituting the water-soluble polymer A of the present invention occupied in the whole polymer, there are preferred ranges. When the phenyl group substituted by a vinyl group binds to a main chain through a cationic group as mentioned above, a ratio of the recurring unit occupied in the polymer as a total composition of 100% by weight is preferably 5% by weight or more, particularly preferably in the range of 10% by weight to 80% by weight.

Also, when the polymer comprises a recurring unit in which the phenyl group substituted by a vinyl group directly binds to a main chain or through a linking group containing no cationic group and a recurring unit having a cationic group, a ratio of the recurring unit having the phenyl group substituted by a vinyl group is preferably in the range of 5% by weight to 70% by weight, particularly preferably in the range of 10% by weight to 50% by weight based on the total amount of the water-soluble polymer A. And a ratio of the recurring unit having a cationic group is preferably in the range of 30% by weight to 95% by weight, particularly preferably in the range of 50% by weight to 90% by weight based on the total amount of the water-soluble polymer A.

When the water-soluble polymer A of the present invention comprises a copolymer with an optional water-soluble or water-insoluble monomer, a ratio of the recurring unit derived from the water-soluble monomer or the water-insoluble monomer is preferably 65% by weight or less, particularly preferably 40% by weight or less.

A weight average molecular weight of the water-soluble polymer A of the present invention is preferably in the range of 1000 to 1,000,000, particularly preferably in the range of 10,000 to 300,000 in terms of a weight average molecular weight. The water-soluble polymer A of the present invention may be used single kind thereof or in combination of two or more kinds in admixture. Here, in the present specification, the weight average molecular weight means a weight average molecular weight measured by high performance liquid chromatography (HPLC) in terms of a standard polystyrene.

Next, the water-soluble polymer having a phenyl group substituted by a vinyl group and having a sulfonate group at the side chain (the water-soluble polymer B) is explained in detail.

The water-soluble polymer B of the present invention is a water-soluble polymer in which the phenyl group substituted by a vinyl group and a sulfonate group both directly bind to a main chain or through an optional linking group. These linking groups are not specifically limited, and may include an optional group, atom or a composite group in which these are combined. The phenyl group substituted by a vinyl group and the sulfonate group may bind independently to the main chain, or the phenyl group substituted by a vinyl group and the sulfonate group may bind in a form of commonly possessing a part or whole of the linking group.

In the above-mentioned phenyl group substituted by a vinyl group, said phenyl group may be substituted, and said vinyl group may be substituted by a halogen atom, a carboxyl group, a sulfo group, a nitro group, a cyano group, an amide group, an amino group, an alkyl group, an aryl group, an alkoxy group, an aryloxy group and the like.

More specifically, the water-soluble polymer B of the present invention is a polymer having groups represented by the following formulae at the side chain.

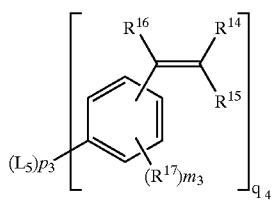

(C-1)

In the formula, $R^{14}$, $R^{15}$ and $R^{16}$ may be the same or different from each other and each have the same meanings as $R^1$, $R^2$ and $R^3$ defined in the formula (I). $R^{17}$ has the same meaning as $R^4$ defined in the formula (I). $L_5$ has the same meaning as $L_1$ defined in the formula (I). $m_3$ is an integer of 0 to 4, $p_3$ is an integer of 0 or 1, and $q_4$ is an integer of 1 to 4.

Of the groups represented by the above formula, those in which $R^{16}$ is a hydrogen atom or a lower alkyl group having 4 or less carbon atoms (for example, a methyl group, an ethyl group), and $R^{14}$ and $R^{15}$ are both hydrogen atoms are preferred. Also, as the linking group $L_5$, those containing a heterocyclic ring are preferred, and $q_4$ is preferably 1 or 2.

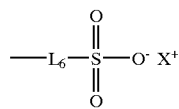

(C-2)

In the formula, $L_6$ has the same meaning as $L_1$ defined in the formula (I). Further, $L_6$ may commonly possess a part or whole of $L_5$ in the above formula.

In the formula, $X^+$ represents a cation supplying a charge necessary for neutralizing a sulfoanion, and may be a monovalent or a polyvalent cation of divalent or more. Specific examples of such cations maybe mentioned an alkalimetal ion (for example, sodium, potassium, magnesium, lithium, calcium, barium, zinc, etc.), an organic ammonium ion (for example, ammonium, triethyl ammonium, pyridinium, tetra-n-butyl ammonium etc.), an iodonium ion (for example, diphenyliodonium, etc.), a sulfoniumion (for example, triphenyl sulfonium, etc.), a diazonium ion and the like. Of these, an alkali metal ion or an organic ammonium ion is particularly preferably used.

A method of introducing the phenyl group substituted by a vinyl group into a polymer is not specifically limited, and when a monomer having said phenyl group substituted by a vinyl group is polymerized, said vinyl group is also expected to be reacted to cause gelation of the polymer, so that it is not preferred. Thus, it is particularly preferred to employ a method in which a precursor polymer having no phenyl group substituted by a vinyl group is previously synthesized, and then, said phenyl group substituted by a vinyl group is introduced into the precursor polymer according to the conventionally known reaction.

A method of introducing a sulfonate group into a polymer is not specifically limited, and a monomer having said sulfonate group may be polymerized or a precursor polymer having no sulfonate group is previously synthesized, and then, said sulfonate group maybe introduced according to the conventionally known reaction.

The water-soluble polymer B of the present invention may be a polymer consisting of a recurring unit having the phenyl group substituted by a vinyl group at the side chain and a recurring unit having the sulfonate group. Or else, it may be a polymer into which other recurring unit(s) is/are introduced so long as it does not prevent the effect of the present invention. Moreover, it maybe a copolymer with other monomer(s). Examples of such monomers may include all the water-soluble monomer and water-insoluble monomer exemplified in the water-soluble polymer A mentioned above. These monomers may be used singly or in combination of two or more. Specific examples of the water-soluble polymer B of the present invention are shown below, but the present invention is not limited by these. A number in the exemplified structural formula means a percent by weight (wt %) of the respective recurring unit in the copolymer as a total composition of 100% by weight.

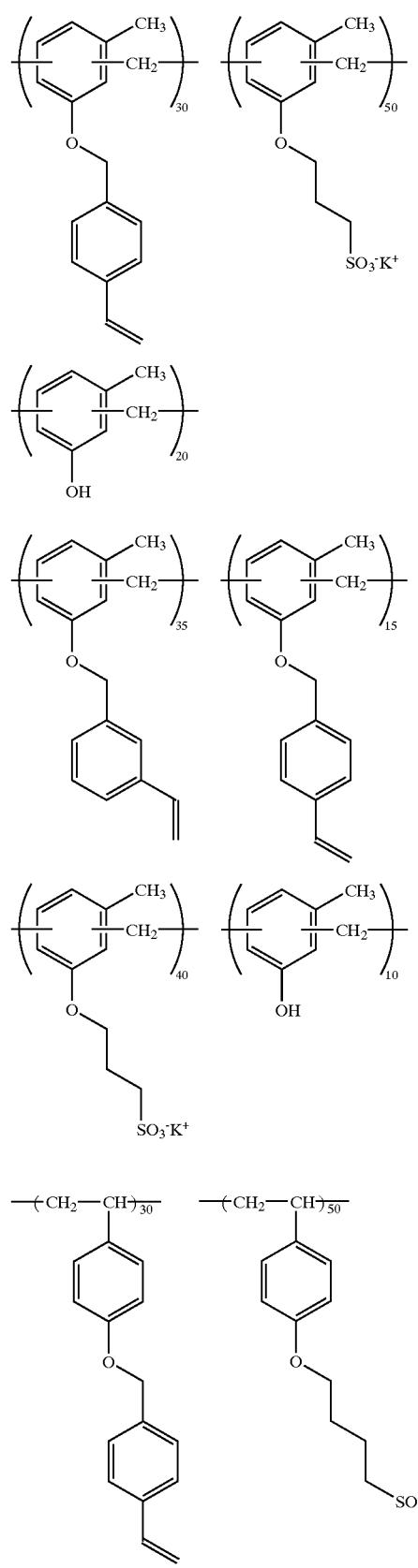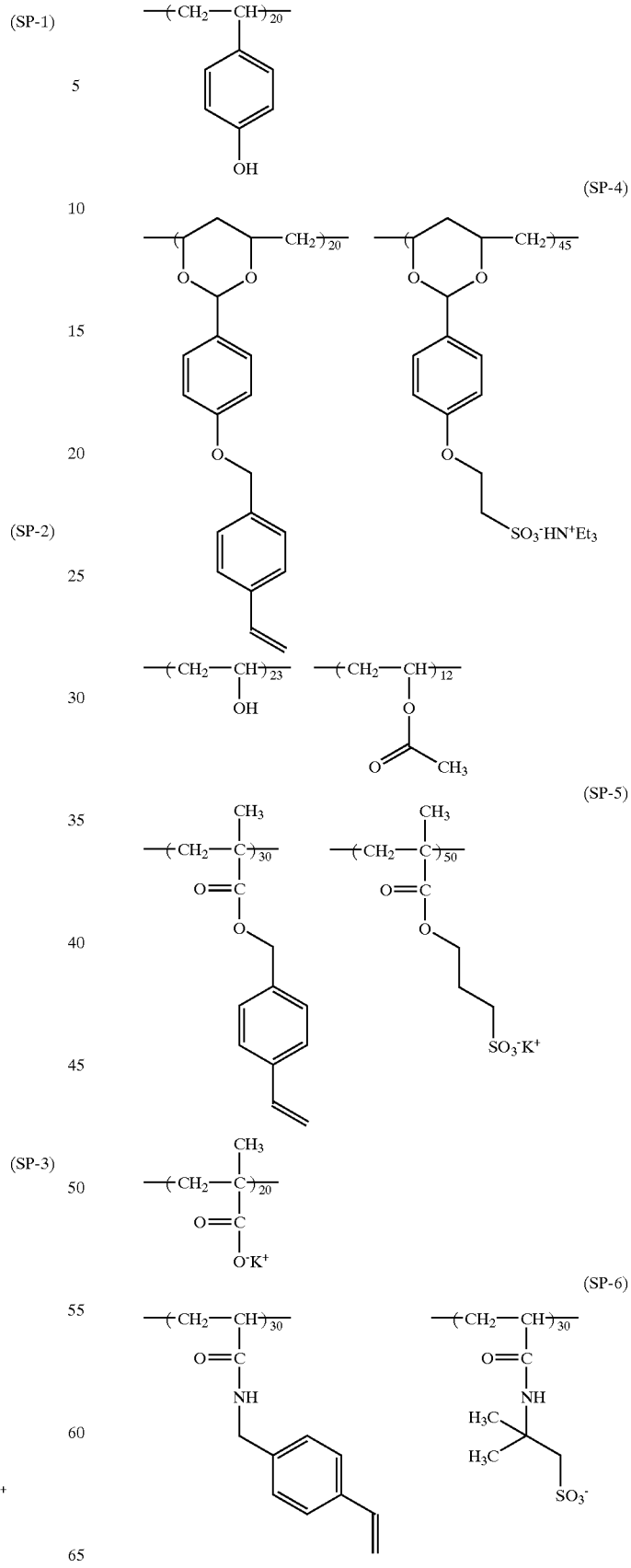

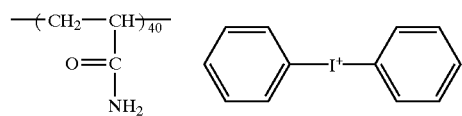
(SP-7)
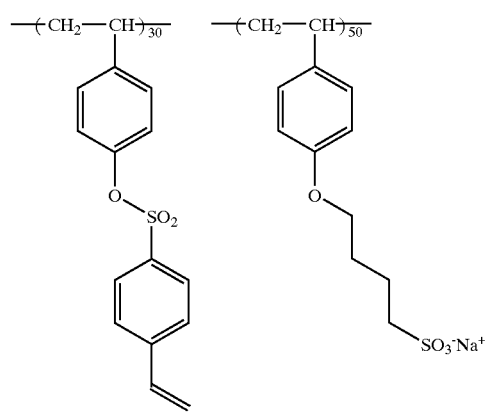
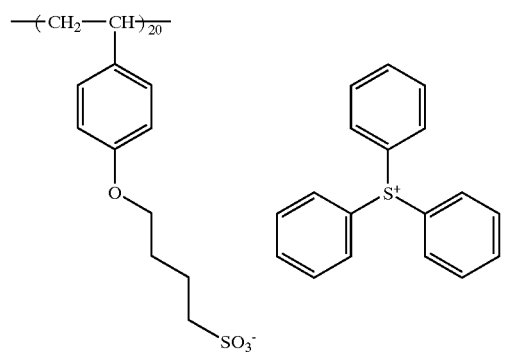
(SP-8)
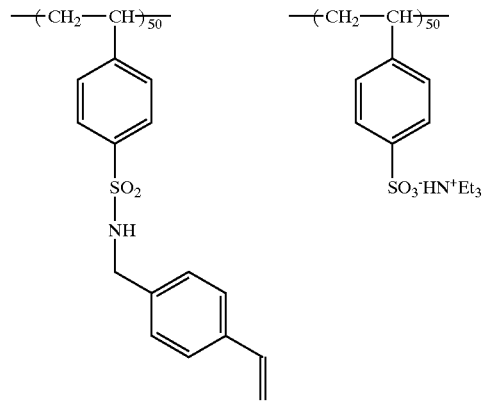
(SP-9)
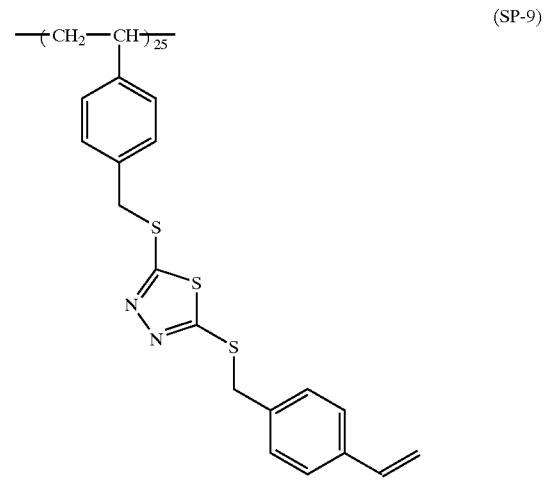
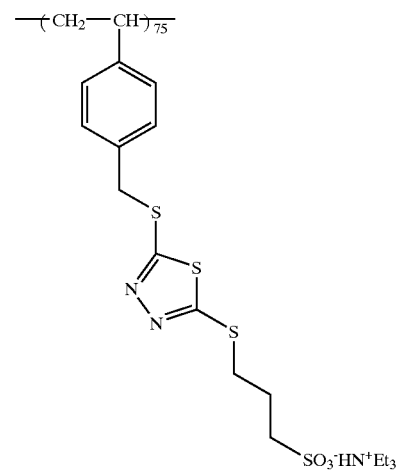
(SP-10)
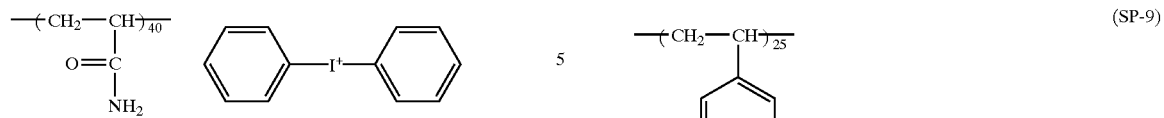

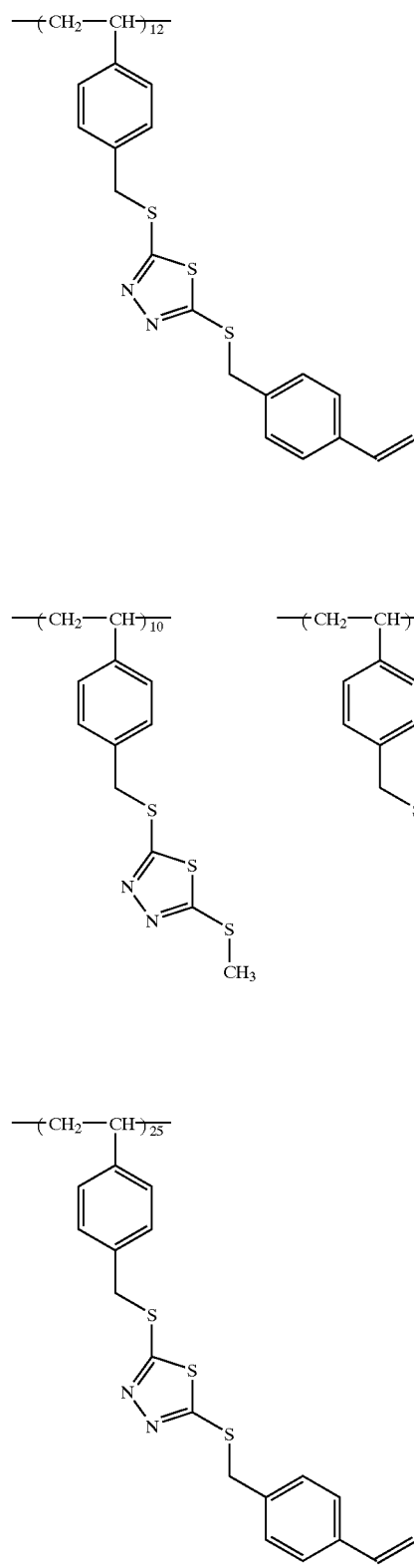

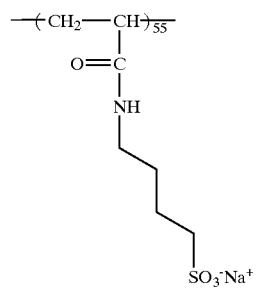 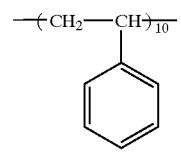
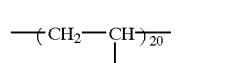
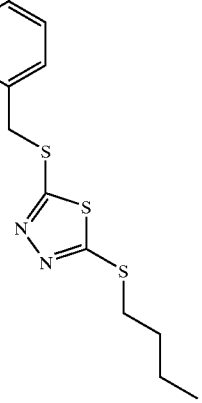
(SP-14)
 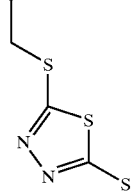
(SP-15)
 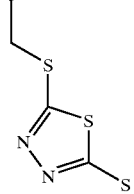
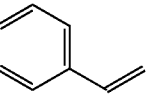
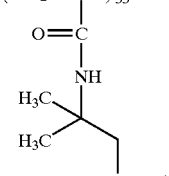 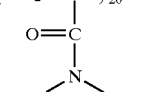
(SP-16)
 
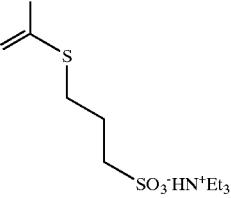

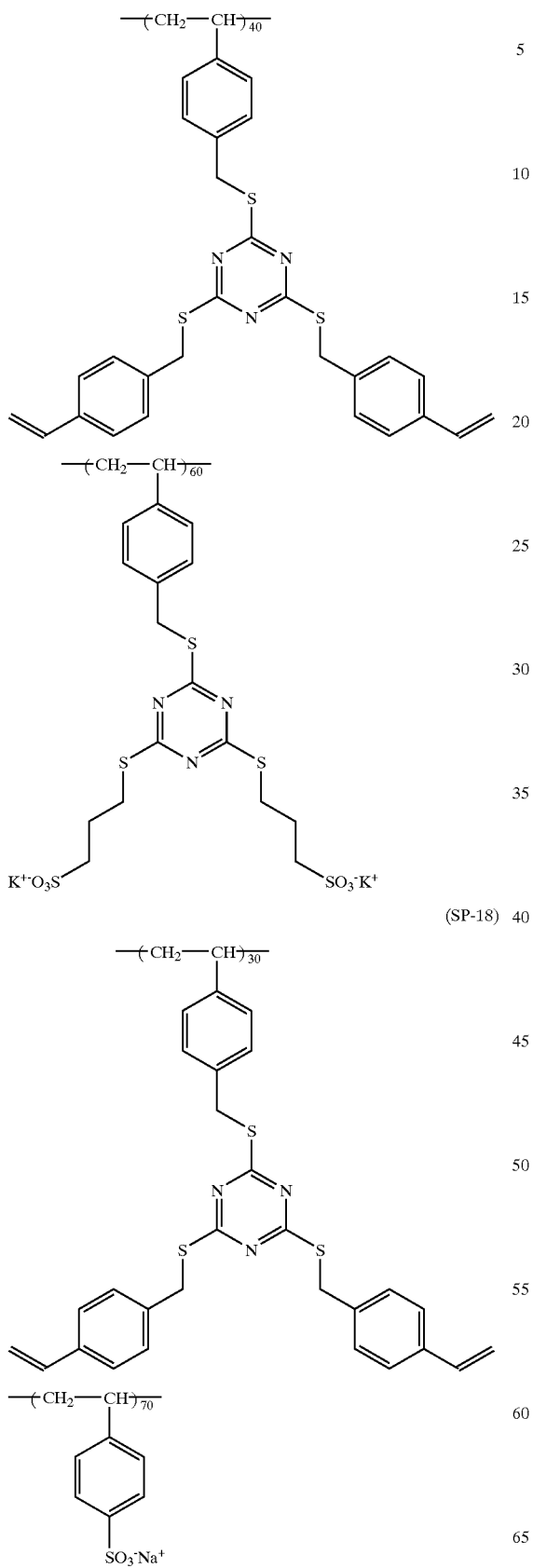
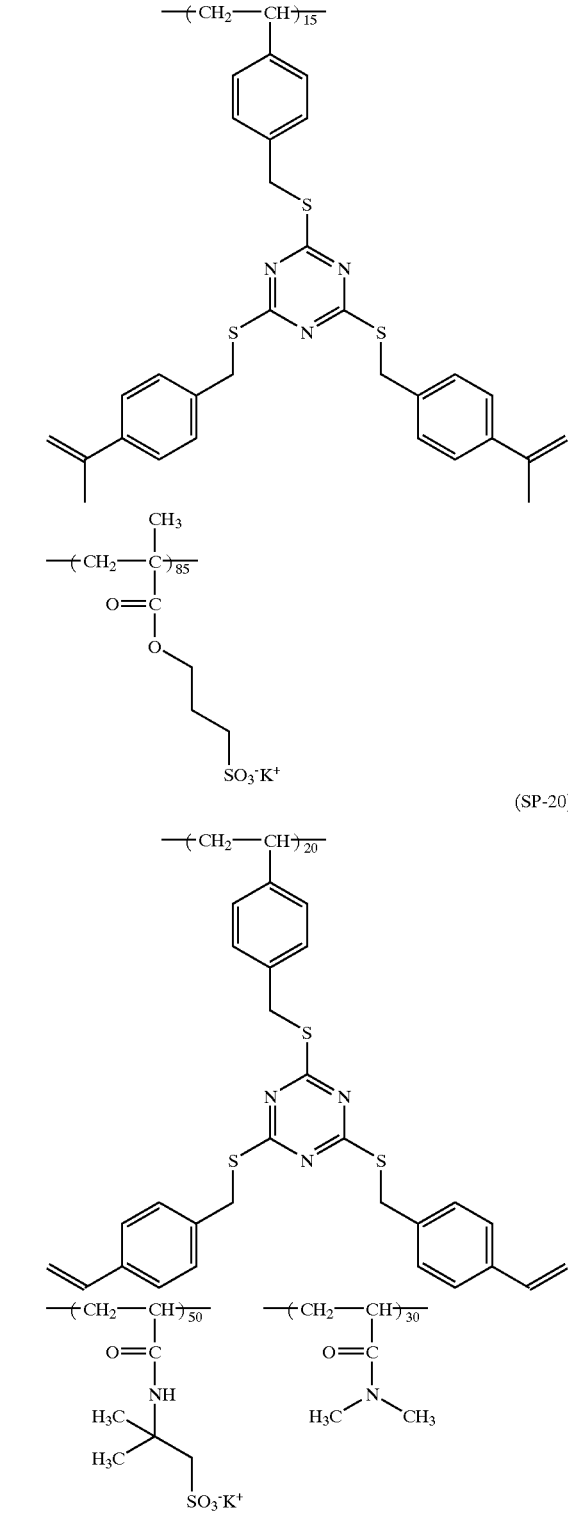
With regard to ratios of the recurring unit in which the phenyl group substituted by a vinyl group directly binds to a main chain or through an optional polyvalent linking group and the recurring unit in which the sulfonate group binds to a main chain through an optional polyvalent linking group constituting the water-soluble polymer B according to the present invention occupied in the whole polymer, there are preferred ranges. A ratio of the recurring unit in which the phenyl group substituted by a vinyl group directly binds to a main chain or through an optional polyvalent linking group occupied in the polymer as a total composition of 100% by weight is preferably 5% by weight to 70% by weight, particularly preferably in the range of 10% by weight to 50% by weight. Also, a ratio of the recurring unit in which the sulfonate group binds to a main chain through an optional polyvalent linking group is preferably in the range of 10% by weight to 95% by weight, particularly preferably in the range of 30% by weight to 90% by weight.

When the water-soluble polymer B of the present invention is constituted by the above recurring units in combination with other optional recurring unit(s), a ratio of the other recurring unit(s) is preferably in the range of 65% by weight or less, particularly preferably in the range of 40% by weight or less.

A weight average molecular weight of the water-soluble polymer B according to the present invention is preferably in the range of 1,000 to 1,000,000, particularly preferably 10,000 to 300,000 which is measured in the same manner as in the water-soluble polymer A mentioned above. The water-soluble polymer B of the present invention may be used singly or in combination of optional two or more kinds.

With regard to solubility in water of the above-mentioned water-soluble polymers A and B of the present invention, there are preferred ranges. That is, the above-mentioned water-soluble polymers A and B are each dissolved in 100 ml of deionized water at 25° C. in an amount of 0.5 g or more, particularly preferably 2.0 g or more.

In the light-sensitive composition of the present invention, optional and conventionally known various kinds of binder resins may be used by mixing with the above-mentioned water-soluble polymers A and B. Such binder resins are not specifically limited, and there may be mentioned a polymer constituted optionally by all the monomers exemplified above, polyvinyl phenol, a phenol resin, polyhydroxybenzal, gelatin, polyvinyl alcohol, a cellulose resin such as carboxymethyl cellulose, a polyimide resin and the like. As these binder resins, a water-soluble resin is preferably used, and a water-soluble binder resin using at least one of the water-soluble monomer exemplified above or a water-soluble binder resin such as gelatin, polyvinyl alcohol, carboxymethyl cellulose and the like is particularly preferred.

In the prior art, when a photoradical polymerization is utilized, it is likely affected by an oxygen in air, so that it is necessary to provide a resin layer such as polyvinyl alcohol which has an oxygen barrier property on the surface of a light-sensitive layer as an overcoating layer. Also, it is necessary to subject to a heat treatment after exposure at a temperature of around 100° C. for several minutes to promote or complete the polymerization.

To the contrary, the water-soluble polymer having a phenyl group substituted by a vinyl group of the present invention has characteristics that it gives a light-sensitive composition which photocures sufficiently without providing such an overcoating layer, and no heat treatment is carried out after exposure. Moreover, it has a characteristic that the light-sensitive composition having high sensitivity can be obtained by using a photopolymerization initiator or a photo-acid generator and a sensitizing dye in combination. Furthermore, the light-sensitive composition of the present invention has an advantage that a latent image regression is extremely little.

The light-sensitive composition using the water-soluble polymers A and B according to the present invention becomes water-insoluble by subjecting to cross-linking of the phenyl group substituted by a vinyl group in the polymer at an exposed portion (a region to which light is irradiated) by a photo-polymerization initiator or a photo-acid generator, while water-solubility of which becomes extremely high at an unexposed portion (a region to which no light is irradiated) by incorporation of a cationic group or a sulfonate group. Accordingly, the unexposed portion (non-image portion) is dissolved and removed by water development while the exposed portion (image portion) remains without dissolution to form a relief image. Characteristic features of the light-sensitive composition according to the present invention reside in extremely high water-solubility at the unexposed portion which can be rapidly dissolved and removed by water development, and suitability for stable water development due to improvement in image strength and hydrophobic property at the exposed portion as well as high resolution. In particular, when the light-sensitive composition of the present invention is utilized for a lithographic printing plate, an ink-receptive property at an image portion is markedly improved, which is difficult in the conventional water-development type lithographic printing plate, and an effect of excellent in printing endurance can be obtained.

In the prior art, it has been known that a polymerization activity of a styrene type monomer using a radical generator is extremely lower than that of the photopolymerization of a (meth) acrylate type monomer using the same. For example, it can be referred to "Light-sensitive Resin", written by Takahiro Tunoda, published by The Japanese Society of Printing Science and Technology, 1972, p. 46. However, in the present invention, by using a water-soluble polymer into which a phenyl group substituted by a vinyl group which is a styrene type material is introduced, it has found out that a light-sensitive composition having high sensitivity and capable of subjecting to water development can be obtained. As an extremely important effect of the light-sensitive composition according to the present invention, it can be mentioned that cross-linking can be carried out without being affected by oxygen in air. Moreover, the inventors have found out that a light-sensitive composition having high sensitivity and capable of effecting water development can be also obtained by using a photo-acid generator.

The light-sensitive composition of the present invention contains at least one of a photopolymerization initiator and a photo-acid generator in addition to the above-mentioned water-soluble polymer(s) A and/or B. As the photopolymerization initiator to be used in the present invention, an optional compound may be used so long as it is a compound capable of generating a radical by irradiation of light or electronic rays.

Examples of the photopolymerization initiator to be used in the present invention may include (a) an aromatic ketone, (b) an aromatic onium salt compound, (c) an organic peroxide, (d) a hexaarylbiimidazole compound, (e) a ketoxime ester compound, (f) an azinium compound, (g) an active ester compound, (h) a metalocene compound, (i) a trihaloalkyl-substituted compound and (j) an organic borate and the like.

As preferred examples of the aromatic ketone (a), there may be mentioned a compound having a benzophenone structure or thioxanthone structure as disclosed in "RADIATION CURING IN POLYMER SCIENCE AND TECHNOLOGY", J. P. FOUASSIER, J. F. RABER (1993), pp.77–177, an α-thiobenzophenone compound as disclosed in Japanese Patent Publication No. 6416/1973, a benzoin ether compound as disclosed in Japanese Patent Publication No. 3981/1973, an α-substituted benzoin ether compound as disclosed in Japanese Patent Publication No. 22326/1973, a benzoin derivative as disclosed in Japanese Patent Publication No. 23664/1973, an aroylphosphonic acid ester as disclosed in Japanese Patent Publication No. 30704/1982, a dialkoxybenzophenone derivative as disclosed in Japanese Patent Publication No. 26483/1985, a benzoin ether derivative as disclosed, in Japanese Patent Publication No. 36403/1985 and Japanese Provisional Patent Publication No. 81345/1987, p-di(dimethylaminobenzoyl)benzene as disclosed in Japanese Provisional Patent Publication No. 211452/1990, a thio-substituted aromatic ketone as disclosed in Japanese Provisional Patent Publication No. 194062/1986, an acylphosphine sulfide as disclosed in Japanese Patent Publication No. 9597/1990, an acylphosphine derivative as disclosed in Japanese Patent Publication No. 9596/1990, a thioxanthone derivative as disclosed in Japanese Patent Publication No. 61950/1988, a coumalin derivative as disclosed in Japanese Patent Publication No. 42864/1984, and the like.

Examples of the aromatic onium salt (b) may include an aromatic onium salt of an element selected from N, P, As, Sb, Bi, O, S, Se, Te and I. As such an aromatic onium salt, there may be mentioned compounds as disclosed in Japanese Patent Publications No. 14277/1977, No. 14278/1977 and No. 14279/1977.

Examples of the organic peroxide (c) may include almost all organic compounds having at least one oxygen—oxygen bond in the molecule, and there maybe preferably used a peroxide ester such as 3,3',4,4'-tetra(tert-butylperoxycarbonyl)benzophenone, 3,3',4,4'-tetra(tert-amylperoxycarbonyl)benzophenone, 3,3',4,4'-tetra(tert-hexylperoxycarbonyl)benzophenone, 3,3',4,4'-tetra(tert-octylperoxycarbonyl)benzophenone, 3,3',4,4'-tetra(cumylperoxycarbonyl)benzophenone, 3,3',4,4'-tetra(p-isopropylcumylperoxycarbonyl)benzophenone, di-tert-butyldiperoxyisophthalate and the like.

Examples of the hexaarylbiimidazole (d) may include a lophine dimer derivative such as 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis-(o-nitrophenyl)-4,4',5,5'-tetraphenylbiimidazole, 2,2'-bis-(o-methylphenyl)-4,4',5,5'-tetraphenylbiimidazole, 2,2'-bis(o-trifluoromethylphenyl)-4,4',5,5'-tetraphenylbiimidazole, and the like as disclosed in Japanese Patent Publications No. 37377/1970 and No. 86516/1969.

Examples of the ketoxime ester (e) may include 3-benzoyl-oxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-p-toluene-sulfonyloxyiminobutan-2-one, 2-ethoxycarbonyloxyimino-1-phenylpropan-1-one, and the like.

Examples of the azinium salt compound (f) may include compound group having an N—O bond as disclosed in Japanese Provisional Patent Publications No.138345/1988, No. 142345/1988, No. 142346/1988, No. 143537/1988 and No. 42363/1981.

Examples of the active ester compound (g) may include an imidosulfonate compound as disclosed in Japanese Patent Publication No. 6223/1987 and an active sulfonate derivative as disclosed in Japanese Patent Publication No. 14340/1988 and Japanese Provisional Patent Publication No. 174831/1984.

Examples of the metalocene compound (h) may include a titanocene compound as disclosed in Japanese Provisional Patent Publications No. 152396/1984, No. 151197/1986, No. 41484/1988, No. 249/1990 and No. 4705/1990, and an iron-allene complex as disclosed in Japanese Provisional Patent Publications No. 304453/1989 and 152109/1989.

Examples of the trihaloalkyl-substituted compound (i) may include a compound having at least one trihaloalkyl group such as a trichloromethyl group, a tribromomethyl group and the like in the molecule. Preferred examples thereof may include a compound in which said trihaloalkyl group binds to a nitrogen-containing heterocyclic ring such as s-triazine or oxadiazole, or a trihaloalkylsulfonyl compound in which said trihaloalkyl group binds to an aromatic ring or a nitrogen-containing heterocyclic ring through a sulfonyl group. For example, there may be specifically mentioned a trihalomethyl-s-triazine compound as disclosed in our co-pending U.S. Ser. No. 09/771,568, U.S. Pat. Nos. 3,954,475, 3,987,037 and 4,189,323, and Japanese Provisional Patent Publications No. 151644/1986, No. 298339/1988, No. 69661/1992 and No. 153859/1999, and a 2-trihalomethyl-1,3,4-oxoadiazole derivative as disclosed in our co-pending U.S. Ser. No. 09/771,568, Japanese Provisional Patent Publications No. 74728/1979, No. 77742/1980, No. 138539/1985, No. 143748/1986, No. 362644/1992 and No. 84649/1999. Also, there may be mentioned a tri-haloalkylsulfonyl compound in which said trihaloalkyl group binds to an aromatic ring or a nitrogen-containing heterocyclic ring through a sulfonyl group as disclosed in our co-pending U.S. Ser. No. 09/771,568, Japanese Provisional Patent Publication No. 2001-290271.

The organic borate (j) is a compound comprising an organic boron anion and a cation forming a salt with the anion. As the cation, there may be mentioned an alkali metal ion, an onium ion such as ammonium, sulfonium, iodonium and phosphonium, or a cationic sensitizing dye. Examples of the organic borate (j) may include an organic boron ammonium compound as disclosed in our co-pending U.S. Ser. No. 09/771,568, Japanese Provisional Patent Publications No.217813/1996, No. 106242/1997, No. 188685/1997, No. 188686/1997 and No. 188710/1997, an organic boron sulfonium compound and an organic boron oxosulfonium compound as disclosed in our co-pending U.S. Ser. No. 09/771, 568, Japanese Provisional Patent Publications No. 175561/1994, No. 175564/1994 and No. 157623/1994, an organic boron iodonium compound as disclosed in Japanese Provisional Patent Publications No. 175553/1994 and No. 175554/1994, an organic boron phosphonium compound as disclosed in our co-pending U.S. Ser. No. 09/771,568, Japanese Provisional Patent Publication No. 188710/1997, and an organic boron transition metal coordinated complex compound as disclosed in Japanese Provisional Patent Publications No. 348011/1994, No.128785/1995, No.140589/1995, No. 292014/1995 and No. 306527/1995. Also, there may be mentioned a cationic dye having an organic boron anion as a counter anion as disclosed in Japanese Provisional Patent Publications No. 143044/1987 and No. 194619/1993.

As the photo-acid generator to be used in the present invention, an optional compound may be used so long as it is a compound which decomposes by irradiation of light or electronic rays and is capable of generating an acid such as a strong acid including hydrochloric acid, sulfonic acid and the like or an acid including a Lewis acid. Examples of the photo-acid generator to be used in the present invention may include (k) an aromatic diazonium salt compound, (l) an o-nitrobenzyl ester compound such as pivalic acid-o-nitrobenzyl ester, benzenesulfonic acid-o-nitrobenzyl ester, (m) a sulfonic acid ester derivative such as 9,10-dimethoxyanthracene-2-sulfonic acid-4-nitrobenzyl ester, pyrrogalloltrismethane sulfonate, naphthoquinonediazide-4-sulfonic acid ester and the like, (n) a sulfone derivative such as dibenzylsulfone, 4-chlorophenyl-4'-methoxyphenyldisulfone; (o) a phosphoric acid ester derivative and (p) a sulfonyldiazomethane compound as disclosed in U.S. Pat. No. 3,332,936 and Japanese Provisional Patent Publications No. 83638/1990, No. 322707/1999 and No. 2000-1469.

When the light-sensitive composition of the present invention is to correspond to short wavelength light of 450 nm or less, either of the above-mentioned photopolymerization initiators and photo-acid generators can be suitably used, and preferably used among these are the aromatic onium salt compound (b), the active ester compound (g), the metalocene compound (h), the trihaloalkyl-substituted compound (i), the organic boron salt (j), the aromatic diazonium salt compound (k), the sulfonic acid ester derivative (m) and the sulfonyldiazomethane compound (p).

Also, when the light-sensitive composition of the present invention is to correspond to visible rays of 450 nm to 750 nm, particularly preferably used are the aromatic onium salt compound (b), the metalocene compound (h), the trihaloalkyl-substituted compound (i), the organic boron salt (j) and the aromatic diazonium salt compound (k).

Moreover, when the light-sensitive composition of the present invention is to correspond to near infrared rays to infrared rays of 750 nm or longer, particularly preferably used are the aromatic onium salt compound (b), the trihaloalkyl-substituted compound (i) and the organic boron salt (j).

The above-mentioned photopolymerization initiator and photo-acid generator may be used singly or in combination of optional two or more compounds. Also, an optional photopolymerization initiator and an optional photo-acid generator may be used in combination. In particular, when the trihaloalkyl-substituted compound (i) and the organic boron salt (j) are used in combination, sensitivity is markedly improved so that it is a preferred combination. An amount of the photopolymerization initiator and photo-acid generator to be contained in the light-sensitive composition is preferably in the range of 1 to 100% by weight in total, more preferably in the range of 1 to 40% by weight in total based on the amount of the water-soluble polymer.

As the other preferred element constituting the light-sensitive composition of the present invention, there may be mentioned a polymerizable monomer having a polymerizable unsaturated group in the molecule. The polymerizable unsaturated group means an ethylenically unsaturated double group capable of polymerizing. In particular, a polyfunctional polymerizing monomer having two or more polymerizable unsaturated groups in the molecule is preferably used. Examples of such a polymerizable monomer include a polyfunctional acrylic monomer such as 1,4-butanediol diacrylate, 1,6-hexanediol diacrylate, neopentyl glycol diacrylate, tetraethylene glycol diacrylate, trisacryloyloxyethyl isocyanurate, tripropylene glycol diacrylate, ethylene glycol glycerol triacrylate, glycerol epoxy triacrylate, trimethylolpropane triacrylate, pentaerythritol triacrylate, pentaerythritol tetraacrylate and the like; a polyfunctional methacrylic monomer which is a corresponding methacrylate of the above-mentioned acrylate monomer; and similar polyfunctional itaconic acid ester monomer, crotonic acid ester monomer and maleic acid ester monomer which are corresponding acid ester monomer of the above-mentioned acrylate monomer.

Examples of the other polymerizable monomer, a styrene derivative may be mentioned. As the styrene derivative, there may be mentioned, for example, 1,4-divinylbenzene, 1,4-diisopropenylbenzene, 1,4-bis(4-vinylbenzyloxy) benzene, 1,2,3-tris(4-vinylbenzyloxy)benzene, 1,3,5-tris(4-vinylbenzyl-oxy)benzene, 2,2-bis[4-(4-vinylbenzyloxy) phenyl]propane, 1,1,2,2-tetrakis[4-(4-vinylbenzyloxy) phenyl]ethane, α,α,α',α'-tetrakis[4-(4-vinylbenzyloxy) phenyl]p-xylene, 1,2-bis(4-vinylbenzylthio)ethane, 1,4-bis (4-vinylbenzyl-thio)butane, bis[2-(4-vinylbenzylthio)ethyl] ether, 2,5-bis-(4-vinylbenzylthio)-1,3,4-thiadiazole, 2,4,6-tris(4-vinyl-benzylthio)-1,3,5-triazine, N,N-bis(4-vinylbenzyl)-N-methylamine, N,N,N',N'-tetrakis(4-vinylbenzyl)-1,2-diamino-ethane, N,N,N',N'-tetrakis(4-vinylbenzyl)p-phenylene-diamine, bis(4-vinylbenzyl) maleate and the like.

In addition to the above-mentioned polymerizable monomer, a polymerizable oligomer having radical polymerizability can be preferably used. Examples of such an oligomer into which an acryloyl group and/or a methacryloyl group is/are introduced may include a polyester (meth) acrylate, a unrethane (meth)-acrylate, an epoxy (meth) acrylate and the like which can be used similarly as in the polymerizable monomer.

With regard to a ratio of the above-mentioned polymerizable monomer and/or polymerizable oligomer and the water-soluble polymer of the present invention, there is a preferred range. That is, the polymerizable monomer and/or polymerizable oligomer is/are preferably used in total in an amount of 0.01 part by weight to 10 parts by weight, more preferably in the range of 0.05 part by weight to 1 part by weight based on 1 part by weight of the polymer.

Next, the light-sensitive composition of the second embodiment according to the present invention is explained. Said light-sensitive composition comprises a cationic monomer having two or more polymerizable unsaturated groups in the molecule (hereinafter referred to as "a cationic monomer"), a polymer and at least one of a photopolymerizable initiator and a photo-acid generator.

The cationic monomer of the present invention has two or more polymerizable unsaturated groups in the molecule, so that an efficiency of cross-linking at the exposed portion is improved whereby a negative type light-sensitive material having high sensitivity and improved in image strength can be prepared. Particularly when water development is carried out, water-solubility becomes extremely high at the unexposed portion by incorporation of the cationic group whereby it is advantageous in the point of effecting water development rapidly.

The cationic monomer of the present invention is described in detail below. Said cationic monomer has at least one cationic group. It is preferably a compound having 1 to 4 cationic groups in the molecule. The cationic group is a group selected from an organic onium group such as an ammonium group, a sulfonium group, a phosphonium group, an iodonium group, an oxonium group and the like, and a quaternary ammonium group is most preferably used among these.

The polymerizable unsaturated group in the present invention means an ethylenically unsaturated double bond group capable of polymerizing. This ethylenically unsaturated double bond group binds to the above-mentioned organic onium group through a linking group. That is, a preferred cationic monomer in the present invention is a compound in which it has 1 to 4 organic onium groups, and two or more of the ethylenically unsaturated double bond groups in total bind to said organic onium group(s) through a linking group constituted by an optional atomic group.

More specifically, preferred specific examples of the cationic monomer of the present invention have at least one structural unit represented by the following formula:

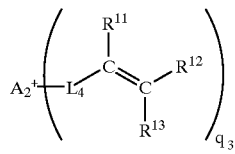

In the formula, $A_2^+$ represents an organic onium group selected from an ammonium group, a sulfonium group, a phosphonium group, an iodonium group and an oxonium group. $R^{11}$, $R^{12}$ and $R^{13}$ may be the same or different from each other and each have the same meanings as $R^1$, $R^2$ and $R^3$ defined in the above-mentioned formula (I). Of these groups, preferred is the case where $R^{12}$ and $R^{13}$ are both hydrogen atoms and $R^{11}$ is a hydrogen atom or a lower alkyl group having 4 or less carbon atoms (for example, a methyl group, an ethyl group and the like). $L_4$ represents a polyvalent linking group comprising atoms or atomic group selected from a hydrogen atom, a carbon atom, a nitrogen atom, an oxygen atom and a sulfur atom, and specifically it is the same as $L_1$ in the above-mentioned formula (I).

In the formula, $q_3$ represents an integer of 1 to 4. Provided that when the cationic monomer of the present invention contains only one unit structure represented by the above formula in the molecule, $q_3$ is an integer of 2 to 4, and when the cationic monomer of the present invention contains two or more unit structures represented by the above formula in the molecule, the organic onium groups represented by $A_2^+$ are bound through an optional polyvalent linking group. As the linking group, those as explained in the above $L_1$ may be mentioned, and the linking group and a N atom, a S atom or a P atom constituting the organic onium group may form a ring structure (for example, a pyridinium ring, a 2-quinolinium ring, a morpholinium ring, a piperidinium ring, a pyrrolidinium ring, a tetrahydrothiophenium ring and the like). These ring structures may be substituted by at least one substituents selected from a halogen atom, a carboxyl group, a sulfo group, a nitro group, a cyano group, an amide group, an amino group, an alkyl group, an aryl group, an alkenyl group, an alkynyl group, a hydroxy group, an alkoxy group, an aryloxy group, an alkylthio group, an arylthio group, an alkylamino group, an arylamino group, an acyl group, an alkoxycarbonyl group, an aryloxycarbonyl group, an alkylsulfonyl group and an arylsulfonyl group.

Specific examples of the cationic monomer having two or more polymerizable unsaturated group in the molecule according to the present invention are described below, but the present invention is not limited by these.

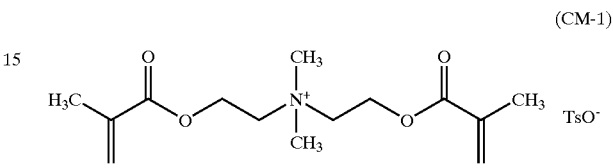
(CM-1)

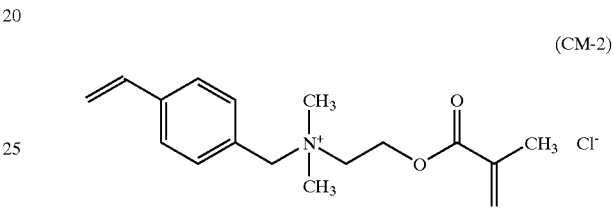
(CM-2)

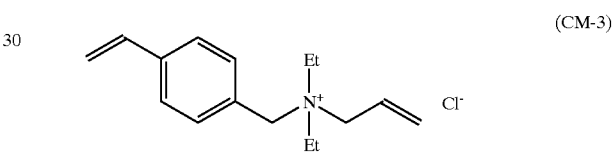
(CM-3)

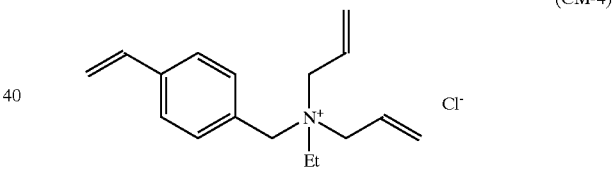
(CM-4)

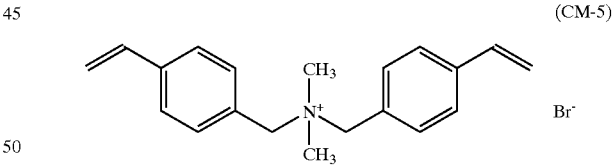
(CM-5)

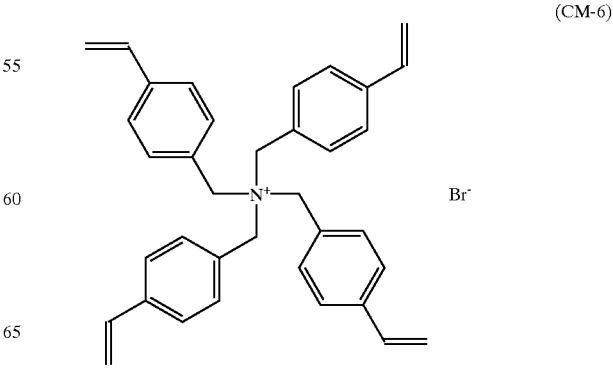
(CM-6)

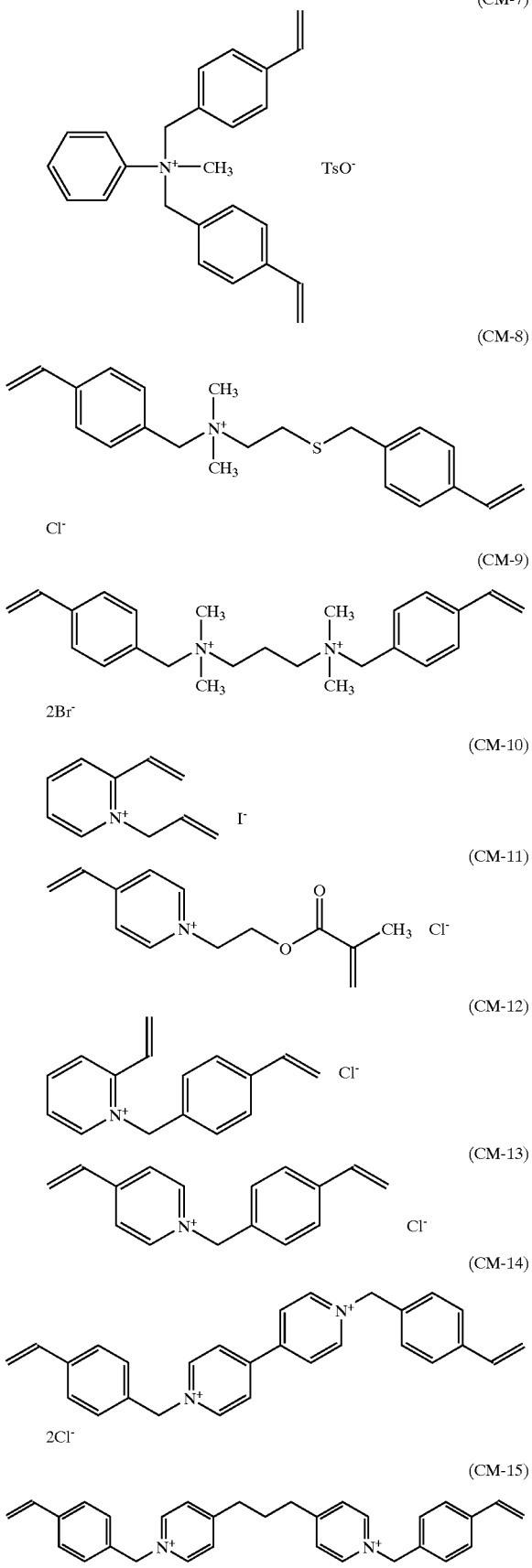
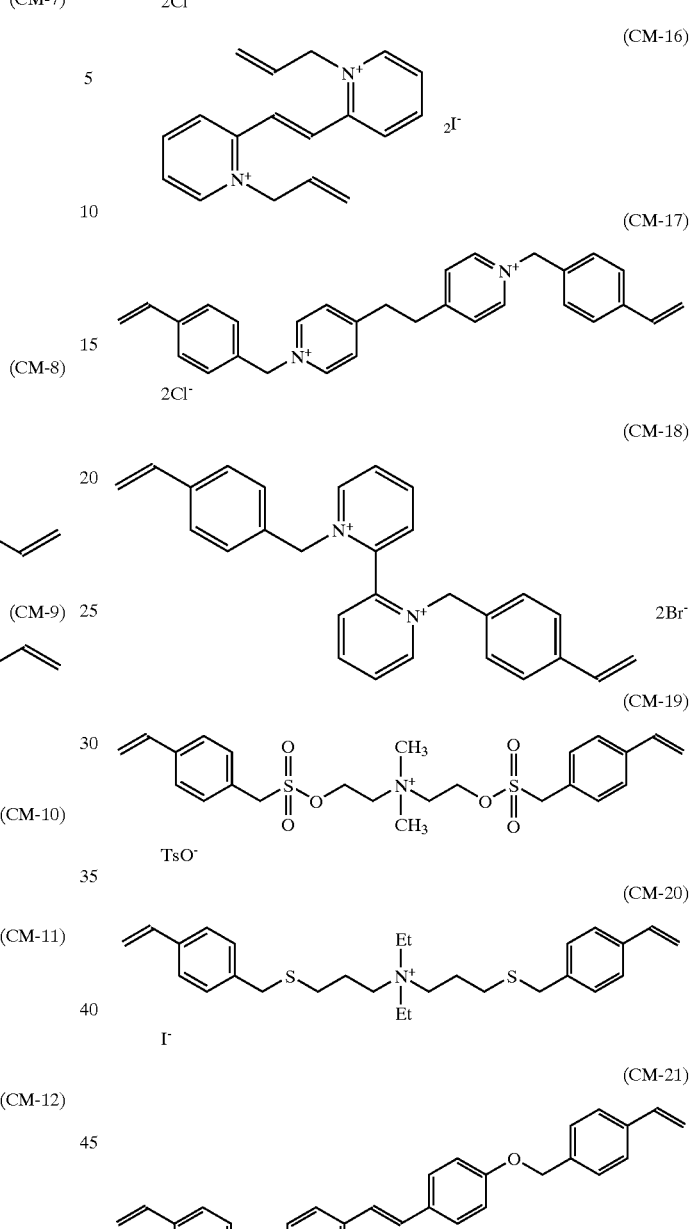

As the polymerizable unsaturated group to be introduced into the cationic monomer of the present invention, a phenyl group substituted by a vinyl group, and a heterocyclic group (for example, a pyridine ring, a quinoline ring and the like) substituted by a vinyl group are preferred. When these polymerizable unsaturated group is introduced, the composition becomes extremely high sensitivity in combination with various kinds of the photopolymerization initiator and/or the photo-acid generator, and difficultly affected by oxygen.

An amount of the cationic monomer of the present invention is preferably in the range of 0.01 part by weight to 10 parts by weight, more preferably in the range of 0.05 part by weight to 1 part by weight based on 1 part by weight of the polymer.

The polymer to be used in combination with the cationic monomer of the present invention is not specifically limited, and conventionally known various kinds of polymers can be used. More specifically, a polymer optionally constituted by at least one of the monomers exemplified in the first embodiment of the present invention can be used.

Examples of the polymers other than the above-mentioned may include polyvinyl phenol, a phenol resin, polyhydroxybenzal, gelatin, polyvinyl alcohol, a cellulose resin such as carboxymethyl cellulose, a polyimide resin and the like.

The above-mentioned polymer is preferably water-soluble. Thus, it is preferably a water-soluble polymer using at least one of the water-soluble monomer exemplified in the first embodiment of the present invention, or a water-soluble binder such as gelatin, polyvinyl alcohol, carboxymethyl cellulose and the like.

Among the polymers to be used in combination with the cationic monomer of the present invention, the water-soluble polymer A or B mentioned in the first embodiment of the present invention is particularly preferred. By using the cationic monomer in combination with the water-soluble polymer A or B of the present invention, a relief image with high sensitivity and high printing endurance can be obtained, and latent image regression can be markedly prevented.

The polymer used in the present invention may be a singly kind of the polymer selected from the above-mentioned polymers or an optional combination of two or more.

As the photopolymerization initiator or the photo-acid generator to be used in combination with the cationic monomer and the polymer of the present invention, the compounds mentioned in the first embodiment can be used singly or in optional combination of two or more.

When the light-sensitive composition constituted by the cationic monomer and the polymer of the present invention is to correspond to short wavelength light of 450 nm or shorter, as a photo-polymerization initiator or a photo-acid generator, there may be preferably used (b) an aromatic onium salt compound, (g) an active ester compound, (h) a metalocene compound, (i) a trihaloalkyl-substituted compound, (j) an organic borate, (k) an aromatic diazonium salt compound, (m) a sulfonic acid ester derivative and (p) a sulfonyldiazomethane compound.

When the above-mentioned light-sensitive composition is to correspond to visible rays of from 450 nm to 750 nm, as a photopolymerization initiator or a photo-acid generator, there may be particularly preferably used (b) an aromatic onium salt compound, (h) a metalocene compound, (i) a trihaloalkyl-substituted compound, (j) an organic borate and (k) an aromatic diazonium salt compound.

Moreover, when it is to correspond to near infrared to infrared rays of 750 nm or longer, as a photopolymerization initiator or a photo-acid generator, there maybe particularly preferably used (b) an aromatic onium salt compound, (i) a trihaloalkyl-substituted compound and (j) an organic borate.

Among the photopolymerization initiators or photo-acid generators mentioned above, it is particularly preferred to use (i) a trihaloalkyl-substituted compound and (j) an organic borate in combination since sensitivity is particularly remarkably improved. An amount of the photopolymerization initiator and/or photo-acid generator is preferably in the range of 1 to 100% by weight, more preferably in the range of 1 to 40% by weight based on an amount of the polymer.

Among the light-sensitive compositions mentioned in the above first and second embodiments of the present invention, a light-sensitive composition using the water-soluble polymer B is particularly preferred since strength at an image portion is particularly excellent. When the light-sensitive composition comprising the water-soluble polymer B is used as a lithographic printing plate, it is particularly suitable for mounting on a printing machine and carrying out printing without subjecting to developing treatment and a lithographic printing plate excellent in printing endurance can be obtained.

The light-sensitive composition of the present invention contains a sensitizer which has absorption at wavelength region from visible rays to infrared rays and sensitizes the above-mentioned photo-radical polymerization initiator so as to correspond to various kinds of light sources from visible rays to infrared rays. As the sensitizer, various kinds of sensitizing dyes maybe preferably used. Such sensitizing dyes may include, for example, cyanine, phthalocyanine, merocyanine, coumarin, porphyrin, a spiro compound, ferrocene, fluorene, fulgide, imidazole, perylene, phenazine, phenothiazine, polyene, an azo compound, diphenylmethane, triphenylmethane, polymethyne acridine, ketocoumarin, quinacridone, indigo, styryl, a squarylium compound, a pyrilium compound, a thiopyrilium compound, etc., and further, compounds disclosed in EP Patent No. 0 568 993, U.S. Pat. Nos. 4,508,811 and 5,227,227 may be used.

In recent years, an output machine mounted thereon a violet laser diode having an oscillation wavelength of 400 to 430 nm has been developed. This output machine has the maximum exposure energy dose of several tens $\mu J/cm^2$ or so and a light-sensitive material to be used is required to have high sensitivity. The light-sensitive composition of the present invention is realized to correspond to this output machine by using the above-mentioned sensitizing dyes in combination. Of these sensitizing dyes, the pyrilium compound and/or the thiopyrilium compound is/are preferred for the violet laser diode.

Also, the light-sensitive composition of the present invention can be extremely suitably used for scanning exposure using laser light of near infrared to infrared rays, i.e., a wavelength region of 700 nm or longer, more preferably 750 to 1100 nm. Preferred examples of dyes to be used for such an object may include those mentioned in U.S. Pat. No. 4,973,572, Japanese Provisional Patent Publications No. 230582/1998, No. 153859/1999, No. 2000-103179 and No. 2000-187322. Of these, particularly preferred dyes may include a cyanine dye, a polymethyne dye, a squarylium dye and a pyrilium compound.

With regard to a content of the above-mentioned sensitizing dyes, there is a preferred range. It is preferably added in the range of 1 to 300mg per 1 m2 of the coated light-sensitive composition, more preferably 5 to 200 mg per 1 $m^2$ of the coated light-sensitive composition.

To the light-sensitive composition of the present invention, other components than the above-mentioned components may be added for various purposes. In particular, various kinds of polymerization inhibitors may be preferably added to prevent from thermal polymerization or thermal cross-linking of polymerizable unsaturated groups and to improve preservability for a long period of preservation. As the polymerization inhibitors in this case, there may be preferably used various kinds of compounds having a phenolic hydroxyl group such as a hydroquinone, catechol, naphthol or cresol compound, or a quinone type compound, particularly preferably hydroquinone. An amount of the polymerization inhibitor to be added is preferably in the range of 0.1 part by weight to 10 parts by weight based on 100 parts by weight of the polymer.

As other elements to constitute the light-sensitive composition, a colorant may be preferably used. The colorant is used for the purpose of heightening recognizability with eyes of an image portion. As the colorant, there may be used various kinds of dyes and pigments including carbon black, phthalocyanine dyes, triarylmethane type dyes, anthraquinone type dyes and azo type dyes. An amount of the colorant is preferably in the range of 0.005 part by weight to 0.5 part by weight based on 1 part by weight of the polymer.

As the element constituting the light-sensitive composition, other elements than the above-mentioned elements may be additionally added for various purposes. For example, for preventing from blocking of the light-sensitive composition or for improving sharpness of an image after development, inorganic fine particles or organic fine particles may be preferably added.

A light-sensitive layer can be formed by coating a light-sensitive coating liquid constituted by the above-mentioned elements on a support and drying. As a method of coating, conventionally known various methods may be used. For example, there may be mentioned a bar coater coating, a curtain coating, a blade coating, an air-knife coating, a roller coating, a rotation coating, a dipping coating and the like. With regard to a thickness of the light-sensitive layer when it is used as a lithographic printing plate, it is preferably formed on a support with a dried thickness in the range of 0.5 $\mu$m to 10 $\mu$m, more preferably in the range of 1 $\mu$m to 5 $\mu$m since printing endurance can be markedly improved.

As a support to be coated by the above-mentioned light-sensitive coating liquid, conventionally know various supports may be used. For example, there may be mentioned paper, a polyethylene-coated paper, a film, a metal plate and the like. When it is used as a lithographic printing plate, a support surface of an unexposed portion becomes a non-image portion, so that a support having a hydrophilic surface is used. As a support for the lithographic printing plate, an aluminum plate which has been grained and anodized and a plastic film having a hydrophilic surface are preferably used.

As an aluminum plate to be preferably used as a support for a lithographic printing plate of the present invention, that which has carried out graining treatment by a mechanical graining, a chemical graining or an electrochemical graining, and then anodizing treatment for the purpose of improving adhesiveness with a photosensitive layer and providing a water-retention property to a non-image portion. If necessary, the surface of said aluminum plate may be further subjected to various kinds of hydrophilic treatments. Examples of such a hydrophilic treatment, there may be mentioned a silicate treatment using an aqueous sodium silicate solution of an alkali metal, a treatment using potassium fluorozirconate, and a treatment using polyvinylphosphonate and the like. In particular, when printing is carried out without effecting development, it is particularly preferred to use an aluminum plate subjected to silicate treatment to improve removing property and water-retention property at the non-image portion.

The light-sensitive composition having the light-sensitive layer thus formed on the support is, after subjecting to close-contact exposure or laser scanning exposure, subjected to pattern forming by removing an unexposed portion by a developing solution. The exposed portion is cross-linked, so that solubility thereof to a developing solution is lowered to form an image portion.

It is one of the important characteristic features of the light-sensitive composition of the present invention that it can be developed with water. The developing solution to be used for water development is different from a conventionally used strongly alkaline developing solution (which usually exceeds a pH of 10) containing a large amount of an alkaline agent, and substantially contains no alkaline agent. Accordingly, a pH of the developing solution to be used for the water development of the present invention is 10 or less, preferably 9.5 or less, more preferably 9 or less. A lower limit of the pH is about 3. The developing solution to be used for water development of the present invention comprises 70% by weight or more of water based on the whole developing solution, more preferably 80% by weight or more. As other additives, there may be added various kinds of organic solvents such as ethanol, isopropanol, n-butyl cellosolve, ethylene glycol, diethylene glycol, triethylene glycol, glycerin, benzyl alcohol and the like, and a surfactant such as an anionic, cationic or nonionic surfactant.

Moreover, when the light-sensitive composition of the present invention is applied to a lithographic printing plate, it is one of the most important characteristic features of the present invention that printing can be carried out by mounting a lithographic printing plate onto a printing machine without carrying out the developing treatment. As an embodiment in this case, there are an embodiment in which after exposing a lithographic printing plate, it is immediately mounted on a printing machine without effecting developing treatment and printing is carried out, and an embodiment in which a lithographic printing plate is exposed in the state of being mounted on a printing machine and printing is carried out immediately thereafter. In these cases, a light-sensitive layer at an unexposed portion which is not cross-linked is swelled by ink or dampening solution, transferred onto paper or a blancket roller whereby it is removed from a support at an initial stage of the printing. On the surface of the support exposed by removing the light-sensitive layer, no ink is adhered, so that the portion becomes a non-image portion. The light-sensitive layer at the exposed portion is cross-linked and cured, so that ink is adhered to form a printing image. That is, when the light-sensitive composition of the present invention is used as a lithographic printing plate, it is possible to carry out printing without specific developing treatment or other treatment.

Next, representative synthetic examples of the water-soluble polymer and the cationic monomer of the present invention are mentioned, and the other exemplified compounds can be also synthesized easily by the same method or referring to the above-mentioned conventionally known methods.

SYNTHETIC EXAMPLE 1

Synthesis of Polymer (CP-1)

In methanol were dissolved 21.0 g of poly(4-vinylpyridine) (available from ALDRICH CHEMICAL COMPANY, INC., weight average molecular weight: 60,000), 0.2 g of 4-tert-butylcatechol (available from Tokyo Kasei Co.) and 18.3 g of 4-chloromethyl-styrene (available from Seimi Chemical Co., CMS-14, tradename), and then, the mixture was stirred under reflux on a hot water bath for 8 hours. After completion of the reaction, methanol was removed under reduced pressure and the residue was washed with ethyl acetate repeatedly to obtain a solid. This solid was collected by filtration and dried to obtain 38.3 g of a white solid.

SYNTHETIC EXAMPLE 2
Synthesis of Polymer (CP-2)

In methanol were dissolved 21.0 g of poly(4-vinylpyridine) (available from ALDRICH CHEMICAL COMPANY, INC., weight average molecular weight: 60,000), 0.2 g of 4-tert-butylcatechol (available from Tokyo Kasei Co.) and 15.3 g of 4-chloromethyl-styrene (available from Seimi Chemical Co., CMS-14, tradename), and then, the mixture was stirred under reflux on a hot water bath for 8 hours. Then, 27.9 g of methyl-p-toluenesulfonate (available from Tokyo Kasei Co.) was added to the mixture and the resulting mixture was stirred under reflux for 6 hours. After completion of the reaction, methanol was removed under reduced pressure and the residue was washed with ethyl acetate repeatedly to obtain a solid. This solid was collected by filtration and dried to obtain 55.2 g of a milky white solid.

SYNTHETIC EXAMPLE 3
Synthesis of Polymer (CP-6)

In 70 g of isopropanol were dissolved 17.8 g of N,N-dimethyl-acrylamide (available from Tokyo Kasei Co.) and 12.6 g of 4-vinyl-pyridine (available from Tokyo Kasei Co.), and under nitrogen atmosphere, the mixture was stirred under heating on a hot water bath. An inner temperature was maintained at 75° C. and 0.3 g of 2,2'-azobisisobutyronitrile (available from Tokyo Kasei Co.) was added to the mixture. A polymerization reaction was carried out at the same temperature for 7 hours. After completion of the polymerization reaction, 0.3 g of N-nitrosophenyl-hydroxylamine ammonium salt (available from Wako Junyaku Kogyo K.K., Q-1300, trade name), 20.2 g of 4-chloromethystyrene (available from Seimi Chemical Co., CMS-14, trade name) and 50 g of methanol were added to the mixture, and the resulting mixture was stirred under reflux on a hot-water bath for 8 hours. After completion of the reaction, the reaction mixture was poured into ethyl acetate and the resulting polymer was washed with ethyl acetate repeatedly to obtain a solid. This solid was collected by filtration and dried to obtain 40.2 g of a pale greenish solid.

SYNTHETIC EXAMPLE 4
Synthesis of cationic monomer (CM-14)

In 500 ml of ethanol were dissolved 15.6 g of 4,4'-bipyridine (available from Tokyo Kasei Co.), 0.4 g of 4-tert-butylcatechol (available from Tokyo Kasei Co.) and 33.6 g of 4-chloromethyl-styrene (available from Seimi Chemical Co., CMS-14, trade name), and then, the mixture was stirred under reflux on a hot water bath for 30 hours. After completion of the reaction, precipitated crystals were collected by filtration, washed with ethanol and dried to obtain 25.5 g of a yellowish solid.

SYNTHETIC EXAMPLE 5
Synthesis of Starting Monomer (SM-1)

In 1.2 kg of methanol was suspended 357.6 g (2.38 mol) of 2,5-dimercapto-1,3,4-thiadiazole (available from Tokyo Kasei Co., bismuthiol), and under water-cooling and stirring, 234.0 g (2.31 mol) of triethylamine (available from Nacalai Tesque Inc.) was added to the suspension over 20 minutes. To the resulting yellowish-orange uniform solution was added dropwise 305.2 (2.00 mol) of 4-chloromethylstyrene (available from Seimi Chemical Co., CMS-14, trade name) over one hour under water-cooling and stirring. After completion of the dropwise addition, the mixture was stirred at the same temperature for 2 hours. After completion of the reaction, precipitated crystals were collected by filtration and washed sufficiently and repeatedly with methanol. This was dried to obtain 357.0 g (yield: 67%) of a starting monomer (SM-1): 2-(4-vinylbenzylthio)-5-mercapto-1,3,4-thiadiazole represented by the following formula.

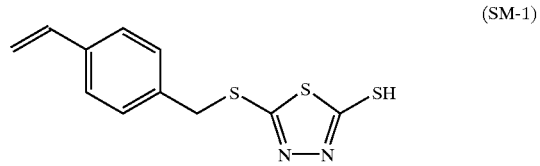

(SM-1)

Synthesis of Intermediate Polymer (SM-2)

In a mixed solvent comprising 710.4 g of ethanol and 177.6 g of deionized water was suspended 66.4g (1.00 mol) of the starting monomer obtained above, and at room temperature under stirring, 121.5 g (1.20 mol) of triethylamine (available from Nacalai Tesque Inc.) was added to the suspension over 20 minutes. The resulting yellowish uniform solution was stirred on a hot water bath under nitrogen atmosphere to regulate the temperature of the mixture to 75° C. At the same temperature, 2.0g of 2,2'-azobisisobutyronitrile (available from Wako Junyaku Kogyo K.K.) was added to the mixture to start polymerization. The polymerization reaction was carried out for 8 hours to obtain a yellowish uniform solution containing an intermediate polymer (SM-2) represented by the following formula. In the solution was dissolved 2.0 g of N-nitrosophenylhydroxylamine ammonium salt (available from Wako Junyaku Kogyo K.K., Q-1300, trade name) as a polymerization inhibitor and this is used for synthesis of a polymer (SP-9) in the next reaction.

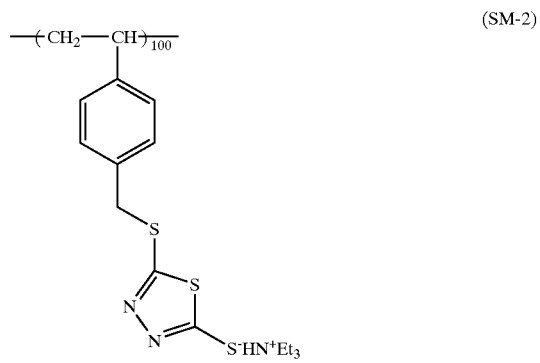

(SM-2)

Synthesis of Polymer (SP-9)

The whole amount of the solution containing the intermediate polymer (SM-2) obtained above was stirred on a hot-water bath to regulate the temperature of the mixture to 50° C. At the same temperature, 73.3g (0.60mol) of propanesultone (available from Tokyo Kasei Co.) was added to the mixture and the resulting mixture was reacted for 3 hours. Then, 73.3 g (0.48 mol) of 4-chloro-methylstyrene (available from Seimi Chemical Co., CMS-14, trade name) was added to the mixture and the mixture was reacted for 3 hours. After completion of the reaction, the reaction mixture was poured into 1.0 kg of diisopropyl ether to form precipitates of a pale yellowish polymer. The supernatant was removed by decantation. The resulting polymer was dissolved in 1.0 kg of methanol, poured into 1.0 kg of diisopropyl ether to carry out reprecipitation. The remained polymer was sufficiently washed with acetone, and then, 2.0 g of N-nitrosophenylhydroxylamine ammonium salt (available from Wako Junyaku Kogyo K.K., Q-1300, trade name) was added to the mixture as a polymerization inhibitor. The mixture was dissolved in methanol so that the total amount became 1.5 kg to obtain a methanol solution of the objective polymer (SP-9). When a solid content of the solution was measured, it was 29% to find out the yielded amount of the polymer of435g and a yield of the polymer of97%. When a molecular weight of the resulting polymer (SP-9) was carried out by gel permeation chromatography, and it was found out that the polymer had a weight average molecular weight of 65,000 (in terms of standard polystyrene).

SYNTHETIC EXAMPLE 6
Synthesis of Polymer (SP-12)

In a mixed solvent comprising 250.0 g of ethanol and 50.0 g of deionized water were suspended 20.9 g (78.4mmol) of the starting monomer (SM-1) obtained in Synthetic example 5, 50.0 g (203.0 mmol) of sulfopropyl methacrylate-potassium salt (available from Tokyo Kasei Co.) and 20.0 g of n-butyl methacrylate (available from Tokyo Kasei Co.), and at room temperature under stirring, 9.5 g (94.1 mmol) of triethylamine (available from Nacalai Tesque Inc.) was added to the suspension. The resulting yellowish uniform solution was stirred on a hot water bath under nitrogen atmosphere to regulate the temperature of the mixture to 75° C. At the same temperature, 1.0 g of 2,2'-azobisisobutyronitrile (available from Wako Junyaku Kogyo K.K.) was added to the mixture to carry out polymerization reaction for 8 hours. After completion of the polymerization reaction, 2.0 g of N-nitrosophenylhydroxylamine ammonium salt (available from Wako Junyaku Kogyo K.K., Q-1300, trade name) was dissolved in the solution, and the temperature of the mixture was regulated to 50° C. At the same temperature, 14.4 g (94.1 mmol) of 4-chloromethylstyrene (available from Seimi Chemical Co., CMS-14, trade name) was added to the mixture and the mixture was reacted for 3 hours. After completion of the reaction, the reaction mixture was poured into 1.0 kg of diisopropyl ether to form precipitates of a pale yellowish polymer. The supernatant was removed by decantation. The resulting polymer was dissolved in 1.0 kg of methanol, poured into 1.0 kg of diisopropyl ether to carry out reprecipitation. The remained polymer was sufficiently washed with acetone, and then, 1.0 g of N-nitrosophenylhydroxylamine ammonium salt (available from Wako Junyaku Kogyo K.K., Q-1300, trade name) was added to the mixture as a polymerization inhibitor. The mixture was dissolved in methanol so that the total amount became 300 g to obtain a methanol solution of the objective polymer (SP-12). When a solid content of the solution was measured, it was 31% to find out the yielded amount of the polymer of 93 g and a yield of the polymer of 93%. When a molecular weight of the resulting polymer (SP-12) was carried out by gel permeation chromatography, and it was found out that the polymer had a weight average molecular weight of 80,000 (in terms of standard polystyrene).

EXAMPLES

In the following, the present invention is explained by referring to Examples, but the scope of the present invention is not limited by these Examples as a matter of course.

Example 1

A coating solution of a light-sensitive composition having the following composition was prepared. Then, the coating solution was coated onto a polyethylene terephthalate film with a thickness of 0.10 mm having a gelatin undercoating layer so that a dried thickness became 2.0 μm and dried to obtain a sample.

Coating Solution

| | |
|---|---|
| Water-soluble polymer A (CP-1) | 3.0 parts by weight |
| Photopolymerization initiator (PI-1) | 1.0 part by weight |
| Basic Blue 7 | 0.1 part by weight |
| Methanol | 50.0 parts by weight |

(PI-1)

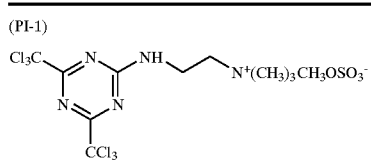

The resulting sample was subjected to contact exposure for 30 seconds through a negative film by using a high pressure mercury lamp with regulating a light dose of 20 mW/cm². After the exposure, when development was carried out for 20 seconds by using tap water a temperature of which was regulated to 25° C., unexposed portions were dissolved out and a clear image pattern was obtained at the exposed portion.

Example 2

A sample was prepared in the same manner as in Example 1 except for additionally using 3.0 parts by weight of pentaerythritol triacrylate as a polymerizable monomer having a polymerizable unsaturated group. This sample was exposed and developed in the same manner as in Example 1 except for changing an exposure time to 10 seconds. As a result, unexposed portions were dissolved out and a clear image pattern was obtained at the exposed portion.

Comparative Example 1

A sample was prepared in the same manner as in Example 1 except for removing the photopolymerization initiator (PI-1) from the light-sensitive composition of Example 1. This sample was exposed and developed in the same manner as in Example 1. As a result, whole portions were dissolved out and no image pattern was obtained.

Comparative Example 2

A sample was prepared in the same manner as in Example 2 except for changing the water-soluble polymer A (CP-1) used in Example 2 to the following polymer (BP-1). This sample was exposed and developed in the same manner as in Example 2. As a result, whole portions were dissolved out and no image pattern was obtained.

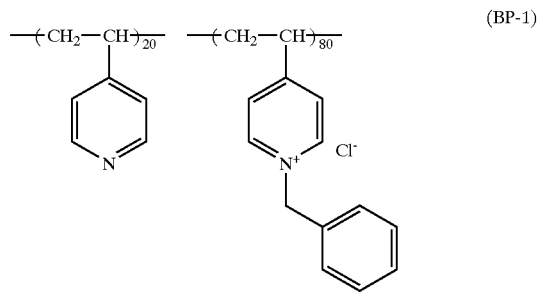

(BP-1)

Example 3

A sample was prepared in the same manner as in Example 2 except for changing the water-soluble polymer A (CP-1)

used in Example 2 to the polymer (CP-12). This sample was exposed and developed in the same manner as in Example 2. As a result, unexposed portions were dissolved out and a clear image pattern was obtained at the exposed portion.

Comparative Example 3

A sample was prepared in the same manner as in Example 3 except for changing the water-soluble polymer A (CP-12) used in Example 3 to the following polymer (BP-2). This sample was exposed and developed in the same manner as in Example 3. As a result, whole portions were dissolved out and no image pattern was obtained.

(BP-2)

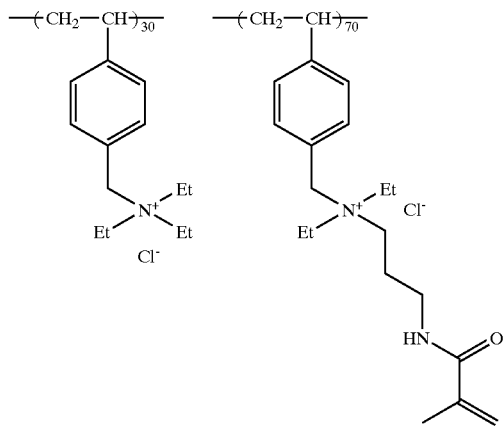

Example 4

A coating solution of a light-sensitive composition having the following composition was prepared. Then, the coating solution was coated onto a polyethylene terephthalate film with a thickness of 0.10 mm having a gelatin undercoating layer so that a dried thickness became 2.0 μm and dried to obtain a sample.
Coating Solution

| Methanol solution (solid content: 29% by weight) of | |
|---|---|
| Water-soluble polymer B (SP-9) | 10.3 parts by weight |
| Photopolymerization initiator (PI-1) | 0.5 part by weight |
| Photopolymerization initiator (P1-2) | 0.7 part by weight |
| Basic Blue 7 | 0.1 part by weight |
| Methanol | 48.4 parts by weight |

(PI-2)

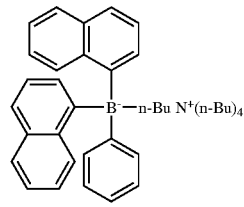

The resulting sample was exposed and developed in the same manner as in Example 1. As a result, unexposed portions were dissolved out and a clear image pattern was obtained at the exposed portion.

Example 5

A light-sensitive composition was prepared in the same manner as in Example 4 except for additionally adding 1.0 part by weight of pentaerythritol triactylate as a polymerizable monomer having a polymerizable unsaturated group. The resulting sample was subjected to contact exposure for 10 seconds through a negative film by using a high pressure mercury lamp with regulating a light dose of 20 mW/cm². After the exposure, when development was carried out for 15 seconds by using a developing solution having the composition as mentioned below a temperature of which was regulated to 15° C., unexposed portions were dissolved out and a clear image pattern was obtained at the exposed portion.

| (Developing solution) | |
|---|---|
| Isopropyl alcohol | 50 parts by weight |
| Tap water | 950 parts by weight |

Comparative Example 4

A sample was prepared in the same manner as in Example 4 except for removing the photopolymerization initiators (PI-1) and (PI-2) from the light-sensitive composition of Example 4. This sample was exposed and developed in the same manner as in Example 1. As a result, whole portions were dissolved out and no image pattern was obtained.

Example 6

A coating solution of a light-sensitive composition having the following composition was prepared. Then, the coating solution was coated onto an aluminum plate subjected to a sand grinding treatment and anodizing treatment with a thickness of 0.24 mm so that a dried thickness became 2.0 μm and dried at 75° C. for 5 minutes to obtain a sample.
Coating Solution

| Water-soluble polymer A (CP-2) | 12.0 parts by weight |
|---|---|
| Photopolymerization initiator (PI-1) | 1.0 part by weight |
| Photopolymerization initiator (PI-2) | 1.0 part by weight |
| Polymerizable monomer (pentaerythritol triactylate) | 3.0 parts by weight |
| Sensitizer (S-1) | 0.5 part by weight |
| Basic Blue 7 | 0.1 part by weight |
| Methanol | 50.0 parts by weight |
| 1,4-Dioxane | 40.0 parts by weight |

(S-1)

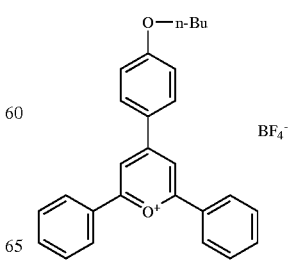

The lithographic printing plate prepared as mentioned above was subjected to an exposure test by using a plate setter on which a violet laser diode (manufactured by ESCHER GRAD Co., Plate Setter Cobalt 8CTP, oscillation wavelength: 410 nm, output: 30 mW) had been mounted. After exposure, development was carried out by using tap water a temperature of which was regulated to 25° C. for 20 seconds. As a result, unexposed portions were dissolved out and a clear image pattern was obtained at the exposed portion. Also, by using a conventional offset printing machine, ink and dampening solution, performances as a printing plate were evaluated. As a result, clear printed materials were obtained up to 100,000 sheets.

Example 7

A coating solution of a light-sensitive composition having the following composition was prepared. Then, the coating solution was coated onto an aluminum plate subjected to a sand grinding treatment and anodizing treatment with a thickness of 0.24 mm so that a dried thickness became 2.0 μm and dried at 75° C. for 5 minutes to obtain a sample.

Coating Solution

| Methanol solution (Solid content: 31% by weight) of | |
|---|---|
| Water-soluble polymer B (SP-12) | 41.9 parts by weight |
| Photopolymerization initiator (PI-1) | 1.0 part by weight |
| Photopolymerization initiator (PI-2) | 1.5 part by weight |
| Polymerizable monomer (T-1) | 3.0 parts by weight |
| Sensitizer (S-1) | 0.5 part by weight |
| Basic Blue 7 | 0.1 part by weight |
| Methanol | 20.0 parts by weight |
| 1,4-Dioxane | 40.0 parts by weight |

(T-1)

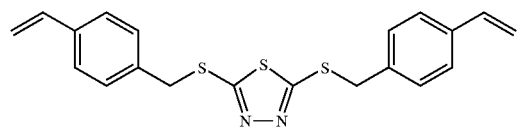

The lithographic printing plate prepared as mentioned above was subjected to exposure and development in the same manner as in Example 6. As a result, unexposed portions were dissolved out and a clear image pattern was obtained at the exposed portion. Also, by using a conventional offset printing machine, ink and dampening solution, performances as a printing plate were evaluated. As a result, clear printed materials were obtained up to 150,000 sheets.

As can be clearly seen from the results of the above Examples 6 and 7, according to the light-sensitive compositions of the present invention, it can be found out that a sharp relief image with high printing endurance can be obtained, which is extremely sensitive to scanning exposure using a violet laser diode without carrying out heat treatment after exposure.

Example 8

A coating solution of a light-sensitive composition having the following composition was prepared. Then, the coating solution was coated onto an aluminum plate subjected to a sand grinding treatment and anodizing treatment with a thickness of 0.24 mm so that a dried thickness became 2.0 μm and dried at 80° C. for 10 minutes to obtain a sample.

Coating Solution

| Water-soluble polymer A (CP-12) | 12.0 parts by weight |
|---|---|
| Photopolymerization initiator (PI-1) | 1.0 part by weight |
| Cationic monomer (CM-14) | 3.0 parts by weight |
| Sensitizer (S-2) | 0.5 part by weight |
| Methanol | 20.0 parts by weight |
| Water | 80.0 parts by weight |

(S-2)

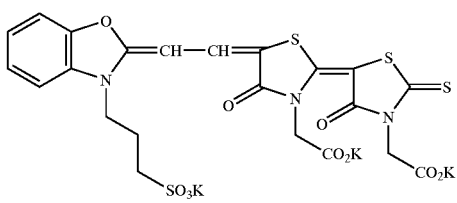

The resulting sample was subjected to exposure as mentioned below. That is, by using a contact exposure machine (Hishira Copy Printing machine, trade name, manufactured by Mitsubishi Paper Mills Co., Ltd.) having a tungsten lamp as a light source, exposure was carried out by interposing an interference filter with 580 nm, adjusting light dose transmitting through the interference filter to 5 mW/cm², and through a control wedge (available from Fuji Photo Film, Co.) having step wedges with density difference of each 0.15 for 30 seconds. After exposure, development was carried out by using tap water a temperature of which was regulated to 25° C. for 20 seconds. In a relief pattern of the step wedges formed on the aluminum plate after development, the maximum step number remained as an image was obtained as sensitivity. As a result, a step number was 9 steps. A larger number of the step number means higher sensitivity.

Example 9

A sample was prepared in the same manner as in Example 8 except for changing the polymer of Example 8 to the polymer (BP-3) having the following chemical structure. The sample was subjected to exposure and development in the same manner as in Example 8, and as a result, a step number was 7 steps.

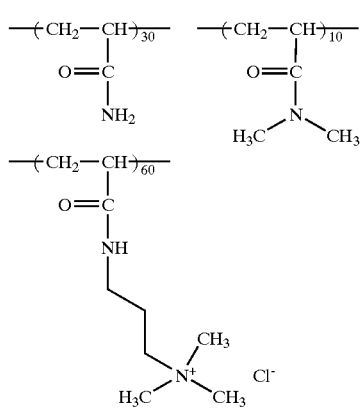

(BP-3)

Comparative Example 5

A sample was prepared in the same manner as in Example 8 except for changing the polymer of Example 8 to (BP-3) and changing the cationic monomer (CM-14) to (T-2) having the following chemical structure. This sample was exposed and developed in the same manner as in Example 8. As a result, whole portions were dissolved out and no image pattern was obtained.

(S-3)

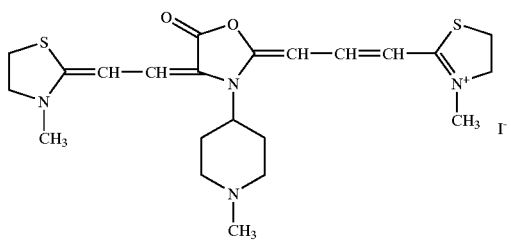

(T-2)

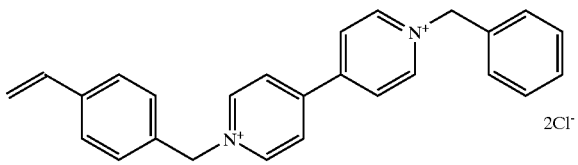

As can be clearly seen from the results of the above Examples 8 and 9 and Comparative example 5, according to the light-sensitive material s of the present invention containing a polymer and a cationic monomer as well as a photopolymerization initiator, and further a sensitizer, it can be found out that a sharp relief image can be obtained, which is extremely sensitive in visible rays region without carrying out heat treatment after exposure. In particular, when the water-soluble polymer A according to the present invention was used as a polymer, a light-sensitive material having further high sensitivity can be obtained.

Examples 10 to 14

A coating solution of a light-sensitive composition having the following composition was prepared. Then, the coating solution was coated onto an aluminum plate subjected to a sand grinding treatment and anodizing treatment with a thickness of 0.24 mm so that a dried thickness became 2.0 μm and dried at 80° C. for 10 minutes to obtain a sample.

Coating Solution

| | |
|---|---|
| Water-soluble polymer B (shown in Table 1) | 12.0 parts by weight |
| Photopolymerization initiator (PI-1) | 1.0 part by weight |
| Photopolymerization initiator (PI-2) | 1.5 part by weight |
| Polymerizable monomer (T-1) | 3.0 parts by weight |
| Sensitizer (S-3) | 0.5 part by weight |
| Basic Blue 7 | 0.1 part by weight |
| Methanol | 60.0 parts by weight |
| 1,4-Dioxane | 40.0 parts by weight |

The resulting samples were subjected to exposure in the same manner as in Example 8, and development was carried out by using a developing solution having the following composition a temperature of which was regulated to 15° C. for 15 seconds. In a relief pattern of the step wedges formed on the aluminum plate after development, the maximum step number remained as an image was obtained as sensitivity. The results are summarized in Table 1.

| (Developing solution) | |
|---|---|
| n-Butyl cellosolve | 30 parts by weight |
| Tap water | 970 parts by weight |

TABLE 1

| | Water-soluble polymer B | Sensitivity (Step number of step wedge) |
|---|---|---|
| Example 10 | SP-3 | 8 |
| Example 11 | SP-5 | 7 |
| Example 12 | SP-9 | 10 |
| Example 13 | SP-12 | 9 |
| Example 14 | SP-18 | 8 |

From the above-mentioned results, according to the light-sensitive materials of the present invention containing a water-soluble polymer B and a photopolymerization initiator as well as a polymerizable monomer having a polymerizable unsaturated group, and further a sensitizer, it can be found out that a sharp relief image can be obtained, which is extremely sensitive in visible rays region without carrying out heat treatment after exposure.

Comparative Example 6

A sample was prepared in the same manner as in Examples 10 to 14 except for changing the water-soluble polymer B of Examples 10 to 14 to the polymer mentioned below. This sample was exposed and developed in the same manner as in Examples 10 to 14. As a result, whole portions were dissolved out and no relief image was obtained.

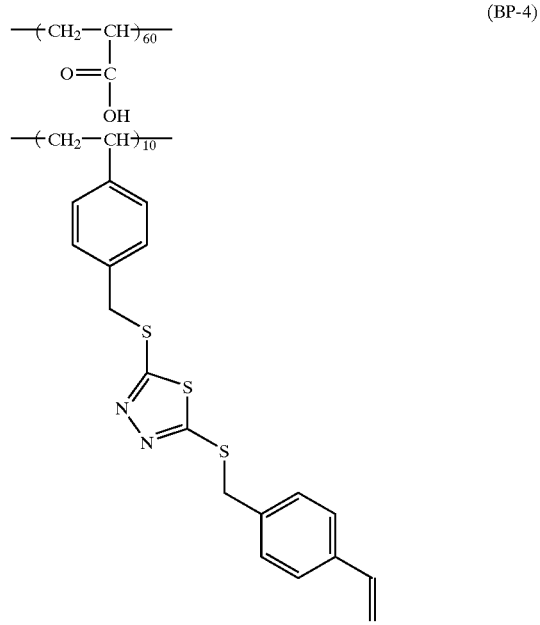

(BP-4)

Examples 15 to 19

A coating solution of a light-sensitive composition having the following composition was prepared. Then, the coating solution was coated onto an aluminum plate subjected to a sand grinding treatment and anodizing treatment with a thickness of 0.24 mm so that a dried thickness became 2.0 μm and dried at 75° C. for 5 minutes to obtain a sample.

Coating Solution

| Water-soluble polymer A (CP-6) | 12.0 parts by weight |
| Photopolymerization initiator (PI-2) | 1.0 part by weight |
| Cationic monomer (shown in Table 2) | 3.0 parts by weight |
| Sensitizer (S-4) | 0.5 part by weight |
| Basic Blue 7 | 0.1 part by weight |
| Methanol | 50.0 parts by weight |
| 1,4-Dioxane | 40.0 parts by weight |

(S-4)

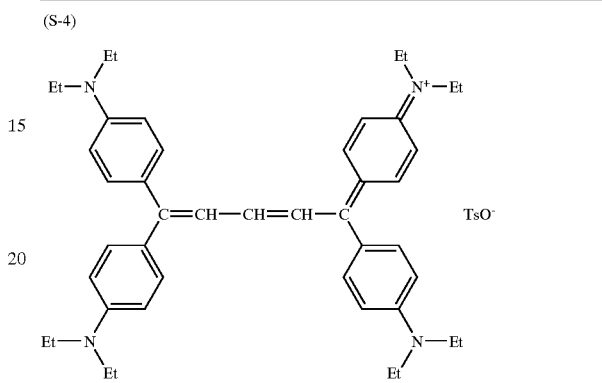

The resulting sample was subjected to exposure as mentioned below. That is, by using a contact exposure machine (Hishira Copy Printing machine, trade name, manufactured by Mitsubishi Paper Mills Co., Ltd.) having a tungsten lamp as a light source, exposure was carried out by using a filter shielding light with a wavelength of 780 nm or shorter, with light dose transmitting through the filter to 3 mW/cm$^2$, and through a control wedge (available from Fuji Photo Film, Co.) having step wedges with density difference of each 0.15 on the filter for 10 seconds. After exposure, development was carried out by using tap water a temperature of which was regulated to 25° C. for 20 seconds. In a relief pattern of the step wedges formed on the aluminum plate after development, the maximum step number remained as an image was obtained as sensitivity. The results are summarized in Table 2.

TABLE 2

| | Cationic monomer | Sensitivity (Step number of step wedge) |
|---|---|---|
| Example 15 | CM-5 | 7 |
| Example 16 | CM-6 | 7 |
| Example 17 | CM-13 | 6 |
| Example 18 | T-3 | 5 |
| Example 19 | T-4 | 4 |

(T-3)

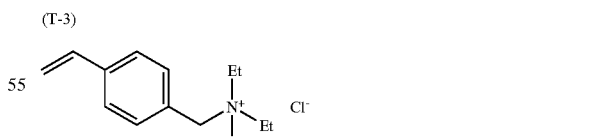

(T-4)

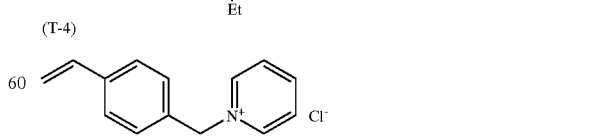

From the above-mentioned results, according to the light-sensitive materials containing a water-soluble polymer A of the present invention, a cationic monomer of the present invention, a photopolymerization initiator and a sensitizer in combination, it can be found out that a sharp relief image can be obtained, which is extremely sensitive in near infrared rays region without carrying out heat treatment after exposure.

Examples 20 to 24

A coating solution of a light-sensitive composition having the following composition was prepared. Then, the coating solution was coated onto an aluminum plate subjected to a sand grinding treatment and anodizing treatment with a thickness of 0.24 mm so that a dried thickness became 2.0 μm and dried at 75° C. for 5 minutes to obtain a sample.

Coating Solution

| | |
|---|---|
| Water-soluble polymer B (shown in Table 3) | 12.0 parts by weight |
| Photopolymerization initiator (PI-1) | 1.0 part by weight |
| Photopolymerization initiator (PI-2) | 1.5 part by weight |
| Polymerizable monomer (T-5) | 3.0 parts by weight |
| Sensitizer (S-5) | 0.5 part by weight |
| Basic Blue 7 | 0.1 part by weight |
| Methanol | 60.0 parts by weight |
| 1,3-Dioxolane | 40.0 parts by weight |

(T-5)

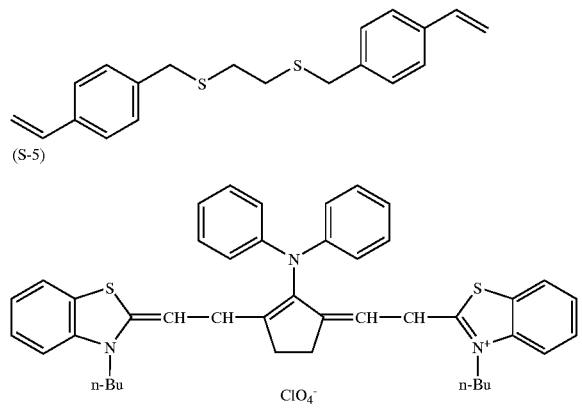

(S-5)

Comparative Example 7

A sample was prepared in the same manner as in Examples 20 to 24 except for changing the water-soluble polymer B to the polymer (BP-5) having the chemical structure shown below.

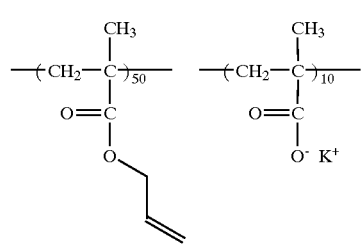

(BP-5)

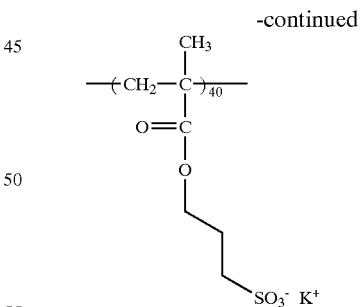

-continued

The resulting light-sensitive materials were exposed in the same manner as in Examples 15 to 19, and then, allowed to stand for within one minute or after 3 hours, these samples were developed by using tap water a temperature of which was regulated to 25° C. for 20 seconds. After development, in a relief pattern of the step wedges formed on the aluminum plate after development, the maximum step number remained as an image was obtained as sensitivity. The results are summarized in Table 3.

TABLE 3

|  | Polymer | Sensitivity (Step number of step wedge) | |
|---|---|---|---|
|  |  | Within 1 minute | After 3 hours |
| Example 20 | SP-4 | 6 | 6 |
| Example 21 | SP-5 | 8 | 8 |
| Example 22 | SP-10 | 8 | 8 |
| Example 23 | SP-11 | 6 | 6 |
| Example 24 | SP-14 | 9 | 9 |
| Comparative example 7 | BP-5 | 2 | No image formed |

From the above-mentioned results, according to the light-sensitive materials containing a water-soluble polymer B of the present invention, a photopolymerization initiator, a polymerizable monomer having a polymerizable unsaturated group, and a sensitizer in combination, it can be found out that a sharp relief image can be obtained, which is extremely sensitive in near infrared rays region without carrying out heat treatment after exposure. Also, it can be understood that the samples of the present invention reveal substantially no latent image regression as compared with that of Comparative example 7.

Example 25

A coating solution of a light-sensitive composition having the following composition was prepared. Then, the coating solution was coated onto an aluminum plate subjected to a sand grinding treatment and anodizing treatment with a thickness of 0.24 mm so that a dried thickness became 2.0 μm and dried at 75° C. for 5 minutes to prepare a lithographic printing plate.

Coating Solution

| Water-soluble polymer A. (CP-2) | 12.0 parts by weight |
| Photopolymerization initiator (PI-1) | 1.0 part by weight |
| Photopolymerization initiator (PI-3) | 1.0 part by weight |
| Cationic monomer (CM-14) | 3.0 parts by weight |
| Sensitizer (S-4) | 0.5 part by weight |
| Basic Blue 7 | 0.1 part by weight |
| Methanol | 50.0 parts by weight |
| 1,4-Dioxane | 40.0 parts by weight |

(PI-3)

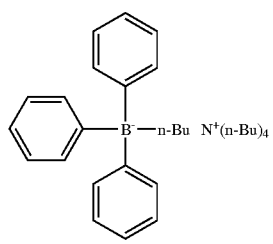

The thus obtained lithographic printing plate was wound on the outer surface of a cylindrical shaped drum, and an exposure test was carried out by variously changing laser beam irradiation energy and drum rotation speed between the drum rotation speed of 300 to 2000 rpm using a semiconductor laser which emits at 830 nm and has an output of 1.2 W (variable from 0 to 1.2 W). At this time, a spot diameter of the laser beam was adjusted to 10 μm. After exposure, when development was carried out with tap water a temperature of which was regulated to 25° C. for 30 seconds within one minute or after one hour after the exposure. A minimum exposure energy for forming a 10 μm line clearly on the aluminum plate was 120 mJ/cm$^2$ when development was carried out within one minute after exposure and 150 mJ/cm$^2$ when development was carried out after one hour after exposure.

When printing endurance of the above-mentioned lithographic printing plate was evaluated by using a usual offset printing machine, ink and dampening water, and as a result, printing image quality was not changed after printing of 150,000 sheets.

Example 26

The light-sensitive composition having the same composition as in Example 25 was coated onto an aluminum plate subjected to a sand grinding treatment, anodizing treatment and silicate treatment by an aqueous sodium silicate solution with a thickness of 0.24 mm so that a dried thickness became 2.5 μm and dried at 75° C. for 7 minutes to prepare a lithographic printing plate. The thus obtained lithographic printing plate was wound on the outer surface of a cylindrical shaped drum, and exposure was carried out by using a semiconductor laser which emits at 830 nm with an exposure energy of 150mJ/cm$^2$. After exposure, without subjecting to developing treatment, it was mounted as such on a usual offset printing machine, and printing was carried out by using usual ink and dampening solution. The non-image portion which is the unexposed portion was removed within 10 sheets from initiation of the printing, and good quality printed materials having no stain at the non-image portion can be obtained with 100,000 sheet.

From the above-mentioned results of Examples 25 and 26, according to the light-sensitive materials containing a water-soluble polymer A, a cationic monomer, a photopolymerization initiator, and a sensitizer in combination, it can be found out that a sharp relief image can be obtained, which is extremely sensitive to scanning exposure by near infrared laser light with substantially no latent image regression and without carrying out heat treatment after exposure. Also, the lithographic printing plate can be mounted on a printing machine without carrying out developing treatment and printing can be carried out. Moreover, good printed materials having no stain at the non-image portion can be obtained.

Example 27

A coating solution of a light-sensitive composition having the following composition was prepared. Then, the coating solution was coated onto an aluminum plate with a thickness of 0.24 mm and subjected to a sand grinding treatment, anodizing treatment and silicate treatment using an aqueous sodium silicate solution so that a dried thickness became 2.5 μm and dried at 75° C. for 5 minutes to prepare a lithographic printing plate.

Coating Solution

| | |
|---|---|
| Water-soluble polymer B (SP-12) | 12.0 parts by weight |
| Photopolymerization initiator (PI-1) | 1.0 part by weight |
| Photopolymerization initiator (PI-4) | 1.0 part by weight |
| Polymerizable monomer (T-6) | 3.0 parts by weight |
| Sensitizer (S-6) | 0.5 part by weight |
| Methanol | 60.0 parts by weight |
| 1,4-Dioxane | 40.0 parts by weight |

(PI-4)

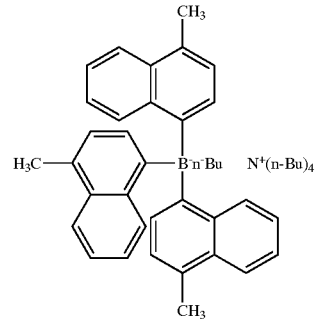

(T-6)

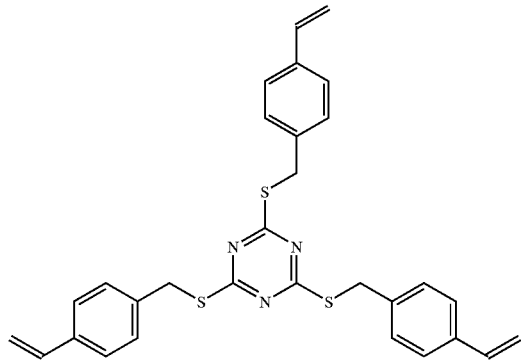

(S-6)

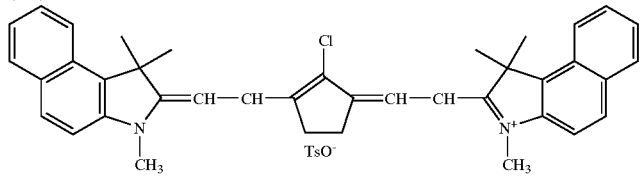

The thus obtained lithographic printing plate was subjected to exposure in the same manner as in Example 25, and development was carried out with tap water a temperature of which was regulated to 25° C. for 20 seconds within one minute or after three hours after the exposure. A minimum exposure energy for forming a 10 μm line clearly on the aluminum plate was 100 mJ/cm² when development was carried out within one minute after exposure and 110 mJ/cm² when development was carried out after three hours after exposure.

When printing endurance of the above-mentioned lithographic printing plate was evaluated by using a usual offset printing machine, ink and dampening water, and as a result, printing image quality was not changed after printing of 150,000 sheets.

Example 28

The same lithographic printing plate as in Example 27 was prepared. The thus obtained lithographic printing plate was wound on the outer surface of a cylindrical shaped drum, and exposure was carried out by using a semiconductor laser which emits at 830 nm with an exposure energy of 120 mJ/cm². After exposure, without subjecting to developing treatment, it was mounted as such on a usual offset printing machine, and printing was carried out by using usual ink and dampening solution. The non-image portion which is the unexposed portion was removed within 10 sheets from initiation of the printing, and good quality printed materials having no stain at the non-image portion can be obtained with 150,000 sheet.

From the above-mentioned results of Examples 27 and 28, according to the light-sensitive materials containing a water-soluble polymer B, a photopolymerization initiator, a polymerizable monomer having a polymerizable unsaturated group in the molecule, and a sensitizer in combination, it can be found out that a sharp relief image can be obtained, which is extremely sensitive to scanning exposure by near infrared laser light with substantially no latent image regression and without carrying out heat treatment after exposure. Also, the lithographic printing plate can be mounted on a printing machine without carrying out developing treatment and printing can be carried out. Moreover, good printed materials having no stain at the non-image portion can be obtained.

What is claimed is:

1. A light-sensitive composition which comprises (A) at least one water-soluble polymer selected from a cationic water-soluble polymer having a phenyl group substituted by a vinyl group at a side chain of the polymer and a water-soluble polymer having a phenyl group substituted by a vinyl group and a sulfonate group at a side chain of the polymer, and (B) at least one of a photopolymerization initiator and a photo-acid generator.

2. The light-sensitive composition according to claim 1, wherein the cationic water-soluble polymer having a phenyl group substituted by a vinyl group at a side chain of the polymer is a cationic water-soluble polymer having a group represented by the following formula (I):

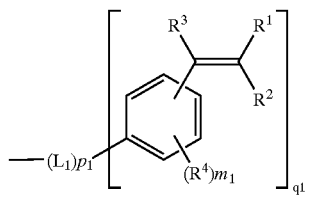

(I)

wherein $R^1$, $R^2$ and $R^3$ may be the same or different from each other and each represent a hydrogen atom, a halogen atom, a carboxyl group, a sulfo group, a nitro group, a cyano group, an amide group, an amino group, an alkyl group, an aryl group, an alkoxy group, an aryloxy group, an alkylthio group, an arylthio group, an alkylamino group, an arylamino group, an acyl group, an alkoxy-carbonyl group, an aryloxycarbonyl group, an alkyl-sulfonyl group or an arylsulfonyl group; $R^4$ represents a substitutable group; $L_1$ represents a polyvalent linking group; $m_1$ is an integer of 0 to 4; $p_1$ is an integer of 0 or 1; and $q_1$ is an integer of 1 to 4, at the side chain thereof.

3. The light-sensitive composition according to claim 1, wherein the cationic water-soluble polymer having a phenyl group substituted by a vinyl group at a side chain of the polymer is a cationic water-soluble polymer in which the phenyl group substituted by a vinyl group bonds to a main chain through a cationic group.

4. The light-sensitive composition according to claim 1, wherein the cationic water-soluble polymer having a phenyl group substituted by a vinyl group at a side chain of the polymer is a cationic water-soluble polymer having a group represented by the following formula:

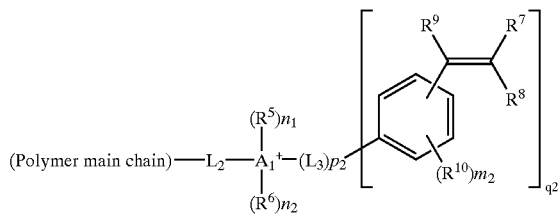

wherein $A_1^+$ represents an organic onium group selected from an ammonium group, a sulfonium group, a phosphonium group, an iodonium group and an oxonium group; $n_1$ and $n_2$ each represent an integer of 0 or 1; provided that $n_1=n_2=0$ when $A_1^+$ is an iodonium group, $n_1=1$ and $n_2=0$ when $A_1^+$ is a sulfonium group or an oxonium group, and $n_1=n_2=1$ when $A_1^+$ is an ammonium group or a phosphonium group; $R^5$ and $R^6$ may be the same or different from each other and each represent an alkyl group, an aryl group or a group represented by the formula (I) defined in claim 2; $R^7$, $R^8$ and $R^9$ may be the same or different from each other and each have the same meanings as $R^1$, $R^2$ and $R^3$ defined in claim 2; $R^{10}$ represents a substitutable group; $L_2$ and $L_3$ each represent a polyvalent linking group; $m_2$ is an integer of 0 to 4; $P_2$ is an integer of 0 or 1; and $q_2$ is an integer of 1 to 4; and a N atom, a S atom or a P atom constituting the organic onium group represented by $A_1^+$ may form a ring structure with at least one group selected from $R^5$, $R^6$, $L_2$ and $L_3$, at the side chain thereof.

5. The light-sensitive composition according to claim 1, wherein the water-soluble polymer having a phenyl group substituted by a vinyl group and a sulfonate group at a side chain of the polymer is a water-soluble polymer having groups represented by the following formulae (C-1) and (C-2):

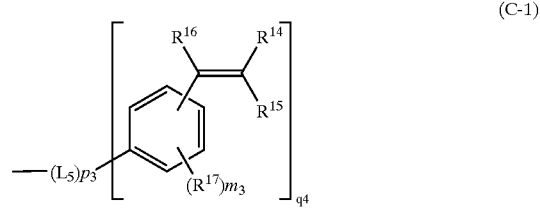

(C-1)

wherein $R^{14}$, $R^{15}$ and $R^{16}$ may be the same or different from each other and each have the same meanings as $R^1$, $R^2$ and $R^3$ defined in claim 2; $R^{17}$ has the same meaning as $R^4$ defined in claim 2; $L_5$ represents a polyvalent linking group; $m_3$ is an integer of 0 to 4; $p_3$ is an integer of 0 or 1; and $q_4$ is an integer of 1 to 4;

(C-2)

wherein $L_6$ represents a polyvalent linking group; $X^+$ represents a cation supplying a charge necessary for neutralizing a sulfo anion; and $L_6$ may commonly possess a part or whole of $L_5$ in the above formula, at a side chain thereof.

6. The light-sensitive composition according to claim 1, wherein the composition further comprises a polymerizable monomer or polymerizable oligomer each having a polymerizable unsaturated group in the molecule.

7. The light-sensitive composition according to claim 1, wherein the composition further comprises a sensitizer which has an absorption at a wavelength region of visible rays to infrared ray and sensitizes the photopolymerization initiator or photo-acid generator.

8. The light-sensitive composition according to claim 1, wherein the composition further comprises a sensitizing dye which has an absorption at a near infrared wavelength region of 750 to 1100 nm and sensitizes the photopolymerization initiator or photo-acid generator.

9. The light-sensitive composition according to claim 1, wherein the composition further comprises a sensitizing dye which has an absorption at a blue color wavelength region of 400 to 430 nm and sensitizes the photopolymerization initiator or photo-acid generator.

10. The light-sensitive composition according to claim 1, wherein the photopolymerization initiator is a trihalo-alkyl-substituted compound or an organic borate.

11. The light-sensitive composition according to claim 1, wherein the photopolymerization initiator is a combination of a trihaloalkyl-substituted compound and an organic borate.

12. A light-sensitive composition which comprises at least one cationic monomer having two or more polymerizable unsaturated groups in the molecule, at least one polymer, and at least one of a photopolymerizable initiator and a photo-acid generator.

13. The light-sensitive composition according to claim 12, wherein the cationic monomer having two or more polymerizable unsaturated groups in the molecule is a cationic monomer having at least one unit structure represented by the formula:

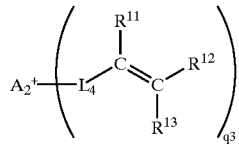

wherein $A_2^+$ represents an organic onium group selected from an ammonium group, a sulfonium group, a phosphonium group, an iodonium group and an oxonium group; $R^{11}$, $R^{12}$ and $R^{13}$ may be the same or different from each other and each have the same meanings as $R^1$, $R^2$ and $R^3$ defined in claim 2; $L_4$ represents a polyvalent linking group; and $q_3$ is an integer of 1 to 4; provided that $q_3$ is an integer of 2 to 4 when the cationic monomer contains a unit structure represented by the above formula in the molecule, and when the cationic monomer contains two or more unit structures represented by the above formula in the molecule, the organic onium groups represented by $A_2^+$ are bound through an optional polyvalent linking group.

14. The light-sensitive composition according to claim 12, wherein the polymer is a water-soluble polymer.

15. The light-sensitive composition according to claim 12, wherein the polymer is a cationic water-soluble polymer having a phenyl group substituted by a vinyl group at a side chain of the polymer.

16. The light-sensitive composition according to claim 12, wherein the composition further comprises a sensitizer which has an absorption at a wavelength region of visible rays to infrared ray and sensitizes the photopolymerization initiator or photo-acid generator.

17. The light-sensitive composition according to claim 12, wherein the composition further comprises a sensitizing dye which has an absorption at a near infrared wavelength region of 750 to 1100 nm and sensitizes the photopolymerization initiator or photo-acid generator.

18. The light-sensitive composition according to claim 12, wherein the composition further comprises a sensitizing dye which has an absorption at a blue color wavelength region of 400 to 430 nm and sensitizes the photopolymerization initiator or photo-acid generator.

19. The light-sensitive composition according to claim 12, wherein the photopolymerization initiator is a trihalo-alkyl-substituted compound or an organic borate.

20. The light-sensitive composition according to claim 12, wherein the photopolymerization initiator is a combination of a trihaloalkyl-substituted compound and an organic borate.

* * * * *